United States Patent
Marbell et al.

(10) Patent No.: US 11,688,673 B2
(45) Date of Patent: Jun. 27, 2023

(54) INTEGRATED PASSIVE DEVICE (IPD) COMPONENTS AND A PACKAGE AND PROCESSES IMPLEMENTING THE SAME

(71) Applicant: WOLFSPEED, INC., Durham, NC (US)

(72) Inventors: Marvin Marbell, Cary, NC (US); Arthur Pun, Raleigh, NC (US); Jeremy Fisher, Raleigh, NC (US); Ulf Andre, Hillsborough, NC (US); Alexander Komposch, Morgan Hill, CA (US)

(73) Assignee: WOLFSPEED, INC., Durham, NC (US)

( * ) Notice: Subject to any disclaimer, the term of this patent is extended or adjusted under 35 U.S.C. 154(b) by 42 days.

(21) Appl. No.: 17/314,160

(22) Filed: May 7, 2021

(65) Prior Publication Data
US 2021/0265250 A1    Aug. 26, 2021

Related U.S. Application Data

(63) Continuation-in-part of application No. 16/797,290, filed on Feb. 21, 2020, now Pat. No. 11,257,740.

(51) Int. Cl.
*H01L 23/498*    (2006.01)
*H01L 23/66*    (2006.01)

(52) U.S. Cl.
CPC ........ *H01L 23/49811* (2013.01); *H01L 23/66* (2013.01); *H01L 2223/6611* (2013.01); *H01L 2223/6644* (2013.01)

(58) Field of Classification Search
CPC ............... H01L 23/49811; H01L 23/66; H01L 2223/6611; H01L 2223/6644; H01L 24/32;
(Continued)

(56) References Cited

U.S. PATENT DOCUMENTS

2010/0178879 A1    7/2010 Sato et al.
2012/0104427 A1    5/2012 Chan et al.
(Continued)

OTHER PUBLICATIONS

International Search Report from PCT/US2021/017393 as prepared by the ISA/US; dated Apr. 23, 2021.
(Continued)

*Primary Examiner* — Elias Ullah
(74) *Attorney, Agent, or Firm* — BakerHostetler

(57) ABSTRACT

An RF transistor package includes a metal submount; a transistor die mounted to the metal submount; and a surface mount IPD component mounted to the metal submount. The surface mount IPD component includes a dielectric substrate that includes a top surface and a bottom surface and at least a first pad and a second pad arranged on a top surface of the surface mount IPD component; at least one surface mount device includes a first terminal and a second terminal, the first terminal of the surface mount device mounted to the first pad and the second terminal mounted to the second pad; at least one of the first terminal and the second terminal being configured to be isolated from the metal submount by the dielectric substrate; and at least one wire bond bonded to the at least one of the first pad and the second pad.

23 Claims, 19 Drawing Sheets

(58) Field of Classification Search
CPC ......... H01L 24/48; H01L 24/49; H01L 24/73; H01L 2224/32245; H01L 2224/45144; H01L 2224/48011; H01L 2224/48091; H01L 2224/48195; H01L 2224/48227; H01L 2224/48247; H01L 2224/49111; H01L 2224/49175; H01L 2224/73265; H01L 2924/00014; H01L 2924/19011; H01L 2924/19105; H01L 23/047; H01L 23/057; H01L 23/4334; H01L 25/16; H01L 2223/6655

See application file for complete search history.

(56) References Cited

U.S. PATENT DOCUMENTS

| | | |
|---|---|---|
| 2013/0341656 A1 | 12/2013 | Chan et al. |
| 2014/0332941 A1 | 11/2014 | Viswanathan et al. |
| 2015/0249021 A1 | 9/2015 | Sanchez et al. |
| 2017/0287820 A1 | 10/2017 | Ahlers et al. |
| 2018/0096922 A1* | 4/2018 | Chen ................ H01L 23/49541 |
| 2018/0175802 A1 | 6/2018 | Wu et al. |
| 2020/0021046 A1 | 1/2020 | Kermalli et al. |

OTHER PUBLICATIONS

International Patent Application No. PCT/US2022/028037; Int'l Search Report and the Written Opinion; dated Aug. 19, 2022; 13 pages.

* cited by examiner

INTEGRATED PASSIVE DEVICE (IPD) COMPONENTS AND A PACKAGE AND PROCESSES IMPLEMENTING THE SAME

CROSS REFERENCE TO PRIOR APPLICATIONS

This application is a continuation in part of U.S. patent application Ser. No. 16/797,290, filed Feb. 21, 2020, which is incorporated herein by reference in its entirety.

FIELD OF THE DISCLOSURE

The disclosure relates to integrated passive device (IPD) components. The disclosure further relates to a package implementing integrated passive device (IPD) components. The disclosure further relates to a radio frequency (RF) package implementing a radio frequency (RF) device with integrated passive device (IPD) components. The disclosure further relates to a radio frequency (RF) power amplifier transistor package implementing an RF device with integrated passive device (IPD) components. The disclosure further relates to a process of making integrated passive device (IPD) components. The disclosure further relates to a process of making a package implementing integrated passive device (IPD) components. The disclosure further relates to a process of making an RF package implementing an RF device with integrated passive device (IPD) components. The disclosure further relates to a process of making a Radio frequency (RF) power amplifier transistor package implementing integrated passive device (IPD) components.

BACKGROUND OF THE DISCLOSURE

Transistor packages such as radio frequency (RF) power amplifier transistor products implement integrated passive device (IPD) components. Typically, the integrated passive device (IPD) components are mounted on printed circuit board (PCB) based substrates, silicon (Si) based substrates, and/or the like. Additionally, transistor packages generate substantial heat that degrades components, reduces efficiency, reduces the reliability, and/or the like. Moreover, demands for greater power from transistor packages results in greater generation of heat.

However, the typical printed circuit board (PCB) based substrates, Si-based substrates, and/or the like have poor thermal conductivity. More specifically, the typical printed circuit board (PCB) based substrates, Si-based substrates, and/or the like will not have high enough thermal conductivity to maintain the transistor components, such as the IPD components, at a low enough temperature required for 10-20 years life-time operation. Accordingly, the elevated temperature of the transistor package degrades components, reduces efficiency, reduces the reliability, and/or the like.

Additionally, the radio frequency (RF) power amplifier transistor products typically implement wire-bond inductance to prevent unacceptable temperature rise for components in the packaged product. For example, using wire-bond inductance in the pre-match for high-power RF devices. However, this results in an increased number of wire bonds that increases manufacturing cost, manufacturing complexity, failure modes, and/or the like.

Accordingly, what is needed is integrated passive device (IPD) components, a RF product that implements integrated passive device (IPD) components, and/or the like configured for improved thermal management, higher power operation without increasing operating temperature, as well as reducing cost, complexity, and failure modes.

SUMMARY OF THE DISCLOSURE

One general aspect includes an RF transistor package that includes a metal submount; a transistor die mounted to said metal submount; a surface mount IPD component mounted to said metal submount, said surface mount IPD component include a dielectric substrate include a top surface and a bottom surface and at least a first pad and a second pad arranged on a top surface of said surface mount IPD component; at least one surface mount device include a first terminal and a second terminal, said first terminal of said surface mount device mounted to said first pad and said second terminal mounted to said second pad; at least one of the first terminal and the second terminal being configured to be isolated from the metal submount by said dielectric substrate; and at least one wire bond bonded to the at least one of the first pad and the second pad.

One general aspect includes a device having a surface mount IPD component configured to be mounted to a metal submount of a transistor package, said surface mount IPD component include a dielectric substrate include a top surface and a bottom surface and at least a first pad and a second pad arranged on a top surface of said surface mount IPD component; at least one surface mount device include a first terminal and a second terminal, said first terminal of said surface mount device mounted to said first pad and said second terminal mounted to said second pad; and at least one of the first terminal and the second terminal being configured to be isolated from the metal submount by said dielectric substrate, where at least one of the first pad and the second pad are configured as wire bond pads.

One general aspect includes a process for implementing an RF transistor package that includes providing a metal submount; mounting a transistor die to said metal submount; mounting a surface mount IPD component to said metal submount, said surface mount IPD component include a dielectric substrate include a top surface and a bottom surface and at least a first pad and a second pad arranged on a top surface of said surface mount IPD component; providing a first terminal and a second terminal on a surface mount device; mounting said first terminal of said surface mount device to said first pad and said second terminal of said surface mount device to said second pad; configuring at least one of the first terminal and the second terminal to be isolated from the metal submount by said dielectric substrate; and bonding at least one wire bond to the at least one of the first pad and the second pad.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
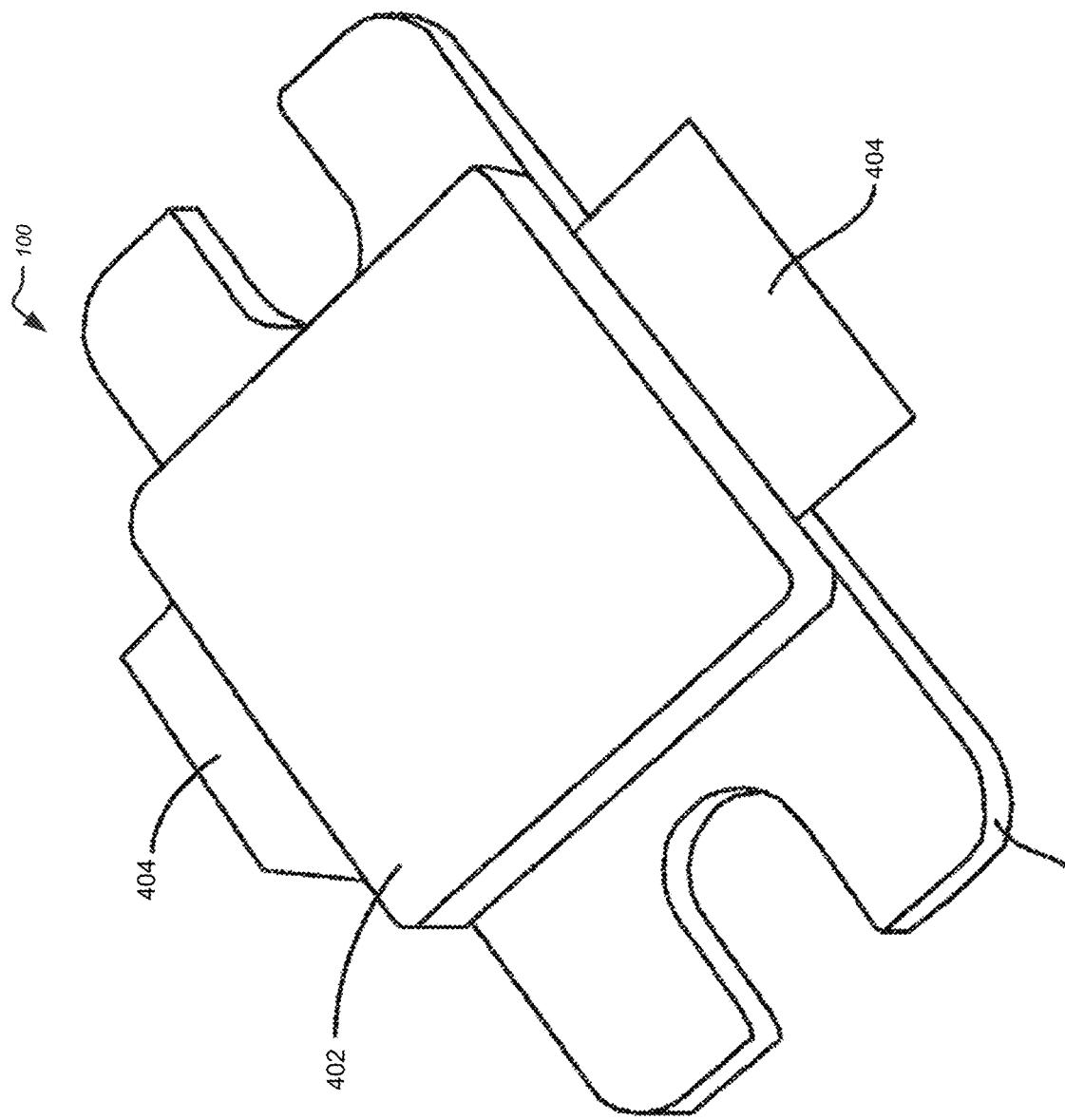
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure is directed to Integrated Passive Device (IPD) components. In particular, the IPD components may be fabricated on dielectric substrates such as Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, thermally conductive high dielectric materials/substrates, and/or other similar thermally conductive, dielectric substrates. In aspects, the IPD components may be used for matching networks, pre-matching, bias-decoupling, thermal-grounding, and/or the like in RF power products and/or the like. The IPD components may be placed inside a package, such as an open cavity package or over-mold package, together with transistor die, such as Gallium nitride (GaN) transistor die, and other capacitors, IPDs, and/or the like and connected with wire bonds to each other and to package leads. Metallization on the top and bottom of the substrate, together with vias routed through the substrate may enable the creation of bond-pads, inductive strips, inductive coils, capacitive stubs, and/or the like. In addition, surface mount devices (SMDs) components, such as capacitors, resistors, inductors, and/or the like may be attached, for example soldered, on top of the IPD components.

According to the disclosure, the IPD components may be fabricated on an Alumina substrate, an Aluminum Nitride (AlN) substrate, a Beryllium oxide (BeO) substrate (230-330 W/mK), and/or other similar thermal conductivity performance dielectric substrates instead of a PCB-based or Si-based substrate. For example, the high thermal conductivity of Alumina (>25 W/m C) enables the IPD components to be used for higher power level operation, placed closer to active die where there will be high electrical RF currents passing through and generating heat, and/or the like. Typical PCB-based substrates will not have high enough thermal conductivity to maintain the IPD components within the low temperature required for 10-20 years life-time operation. Additionally, inductive traces on the disclosed substrate, such as strips, coils, and/or the like may be used to replace (or reduce) the wire-bond inductance needed for various implementations, such as implementations in the pre-match for high-power RF devices, without risking exceeding the acceptable temperature rise for components in the packaged product.

The disclosed IPD components may utilize the substrate, such as high bulk resistivity of the Alumina substrate (1e14 uOhm-cm), that may enable configurations of the IPD components with high Q, low loss, and/or the like thus increasing efficiency, gain, and/or the like of RF products using these components. Compared to low-resistivity PCB-based substrates implementing IPDs and Si based substrates implementing IPDs, which have rapidly increasing losses at higher frequencies, the high-resistive Alumina based substrates implementing IPD components, such as high-resistive Alumina substrate implementing IPD components, have been found to have improved performance at higher frequencies, reliability, and/or the like.

For example, Alumina has a higher dielectric constant (er=9.8) in comparison to Si and PCB, which can be an advantage in certain cases. For example, aspects of the disclosure may implement a low value embedded and/or integrated capacitor by using and/or configuring the Alumina dielectric substrate and a top and/or a bottom metallization on the IPD components. This construction can be used for example to create a second harmonic termination stub, a third harmonic termination stub, and/or the like for input pre-matching, output pre-matching, and/or the like in the RF power device.

Additionally, the coefficient of thermal expansion for Alumina is low (7.0) for implementation as a substrate of the disclosed IPD components. In this regard, Alumina for implementation as a substrate of the disclosed IPD components makes a good match for certain flange applications to reduce and/or avoid delamination of components. The disclosed IPD components are configured to present an equally distributed impedance across a width and/or a span of the active die, to avoid power loss due to non-equal distributed effects.

FIG. 1 illustrates a perspective view of a package according to the disclosure.

Figure 2:
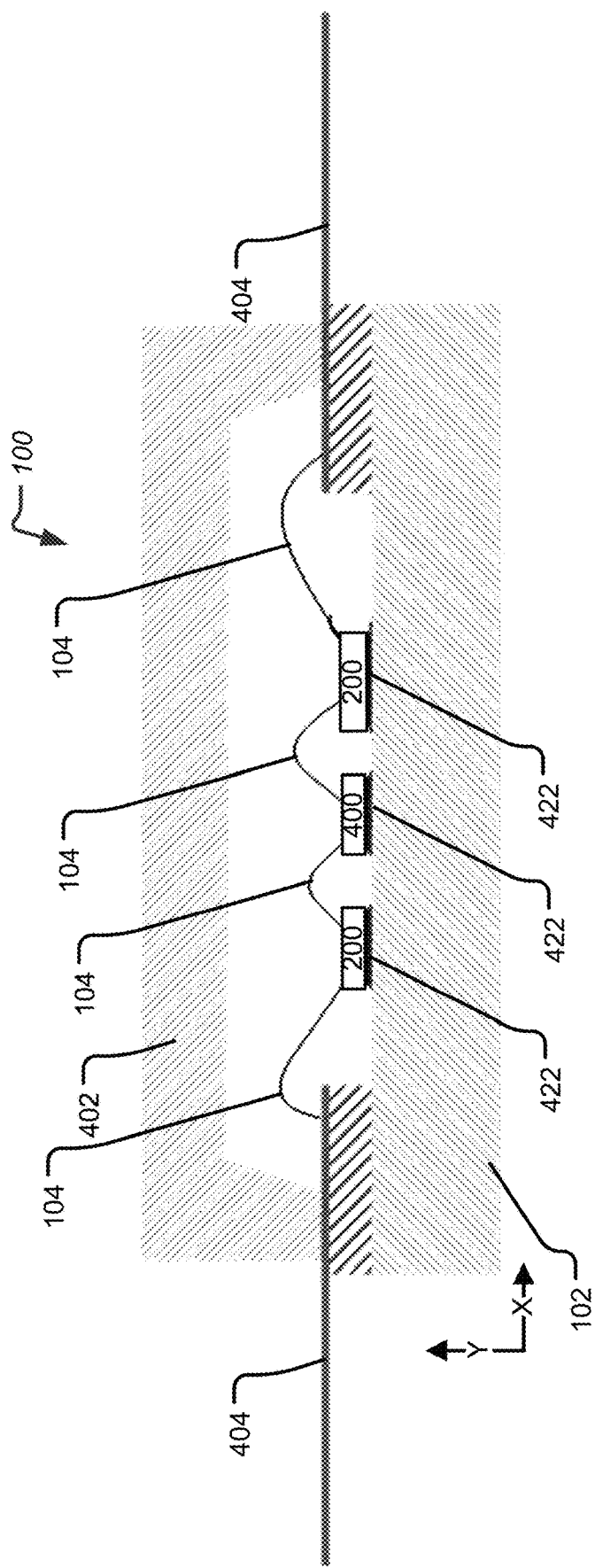
FIG. 2 illustrates a cross-sectional view of the package according to the disclosure.

FIG. 2 illustrates a cross-sectional view of the package according to the disclosure.

Figure 3:
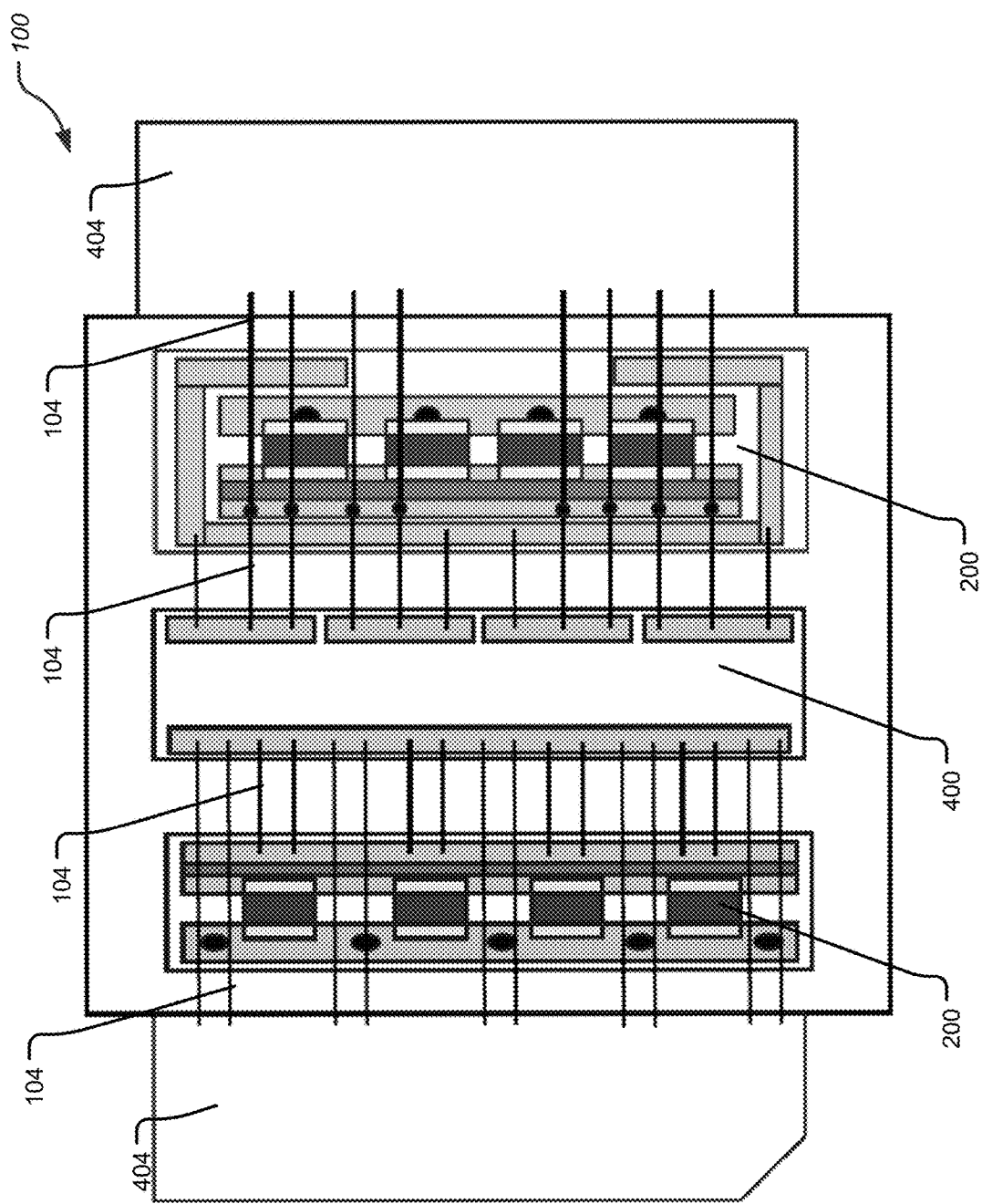
FIG. 3 illustrates a partial top view of the package according to a particular aspect of the disclosure.

FIG. 3 illustrates a partial top view of the package according to a particular aspect of the disclosure.

Figure 4:
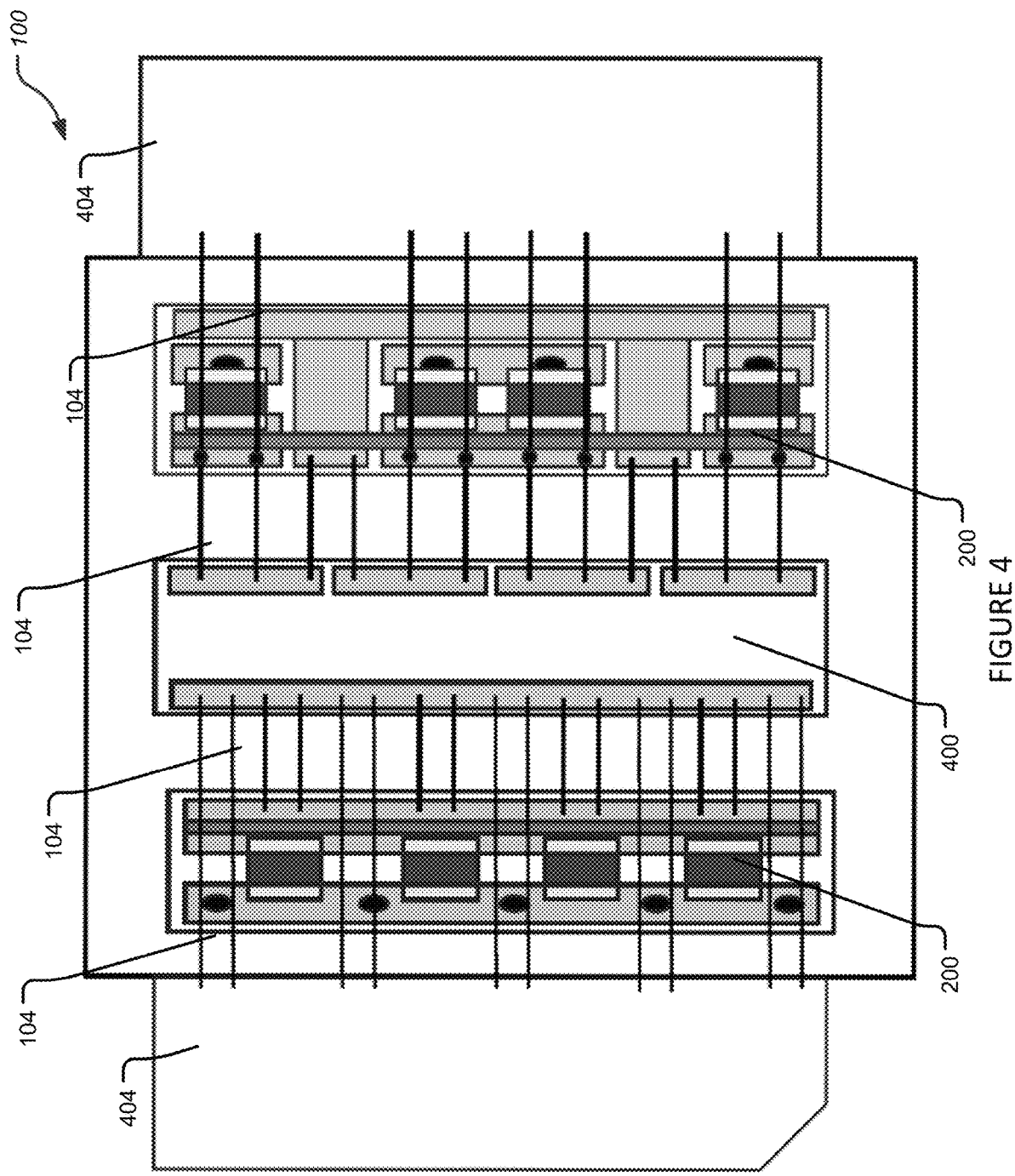
FIG. 4 illustrates a partial top view of the package according to another particular aspect of the disclosure.

FIG. 4 illustrates a partial top view of the package according to another particular aspect of the disclosure.

In particular, FIG. 1, FIG. 2, FIG. 3, and FIG. 4 show an exemplary implementation of a package 100 that may include any one or more other features, components, arrangements, and the like as described herein. In particular, FIG. 1, FIG. 2, FIG. 3, and FIG. 4 show the package 100 that may be implemented as a RF package, a RF amplifier package, a RF power amplifier package, a RF power transistor package, a RF power amplifier transistor package, and/or the like as described herein. The package 100 may include one or more semiconductor devices 400 and at least one IPD component 200. In aspects, the package 100 may include a plurality of the at least one IPD component 200; in aspects the package 100 may include a single implementation of the at least one IPD component 200; and in aspects the package 100 may include a plurality of parallel implementations of the at least one IPD component 200.

The at least one IPD component 200 may be implemented as a RF device as described herein. The at least one IPD component 200 may implement matching networks, harmonic termination circuitry, integrated passive devices (IPD), capacitors, resistors, inductors, and/or the like. As further described herein, the at least one IPD component 200 may be implemented with thermal conductivity, thermal management, and/or the like increasing efficiency, performance, and/or reliability.

The one or more semiconductor devices 400 may be a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration and/or the like.

The package 100 may be implemented to include an open cavity configuration suitable for use with the at least one IPD component 200 of the disclosure. In particular, the open cavity configuration may utilize an open cavity package design. In some aspects, the open cavity configuration may include a lid or other enclosure for protecting interconnects, circuit components, the at least one IPD component 200, the one or more semiconductor devices 400, and/or the like. The package 100 may include a ceramic body 402 and one or more metal contacts 404. In other aspects, the package 100 may include a plurality of the one or more metal contacts 404; and in aspects the package 100 may include a plurality of parallel implementations of the one or more metal contacts 404 and parallel implementations of the one or more semiconductor devices 400.

Inside the package 100, the one or more semiconductor devices 400 may be attached to a support 102 via a die attach material 422. One or more interconnects 104 may couple the one or more semiconductor devices 400 to a first one of the one or more metal contacts 404, a second one of the one or more metal contacts 404, the at least one IPD component 200, and/or the like. Additionally, inside the package 100, the at least one IPD component 200 may be arranged on the support 102 via a die attach material 422 with the one or more interconnects 104 shown in an exemplary configuration that may connect between the package 100, the at least one IPD component 200, and/or the one or more semiconductor devices 400. The support 102 may dissipate the heat generated by the one or more semiconductor devices 400 and the at least one IPD component 200, while simultaneously isolating and protecting the one or more semiconductor devices 400 and the at least one IPD component 200 from the outside environment.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Additionally, the one or more semiconductor devices 400 may include one or more transistor dies that may include one or more laterally-diffused metal-oxide semiconductor (LDMOS) transistors, GaN based transistors, Metal Semiconductor Field-Effect transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMT), Wide Band Gap (WBG) transistors, and/or the like.

Figure 5:
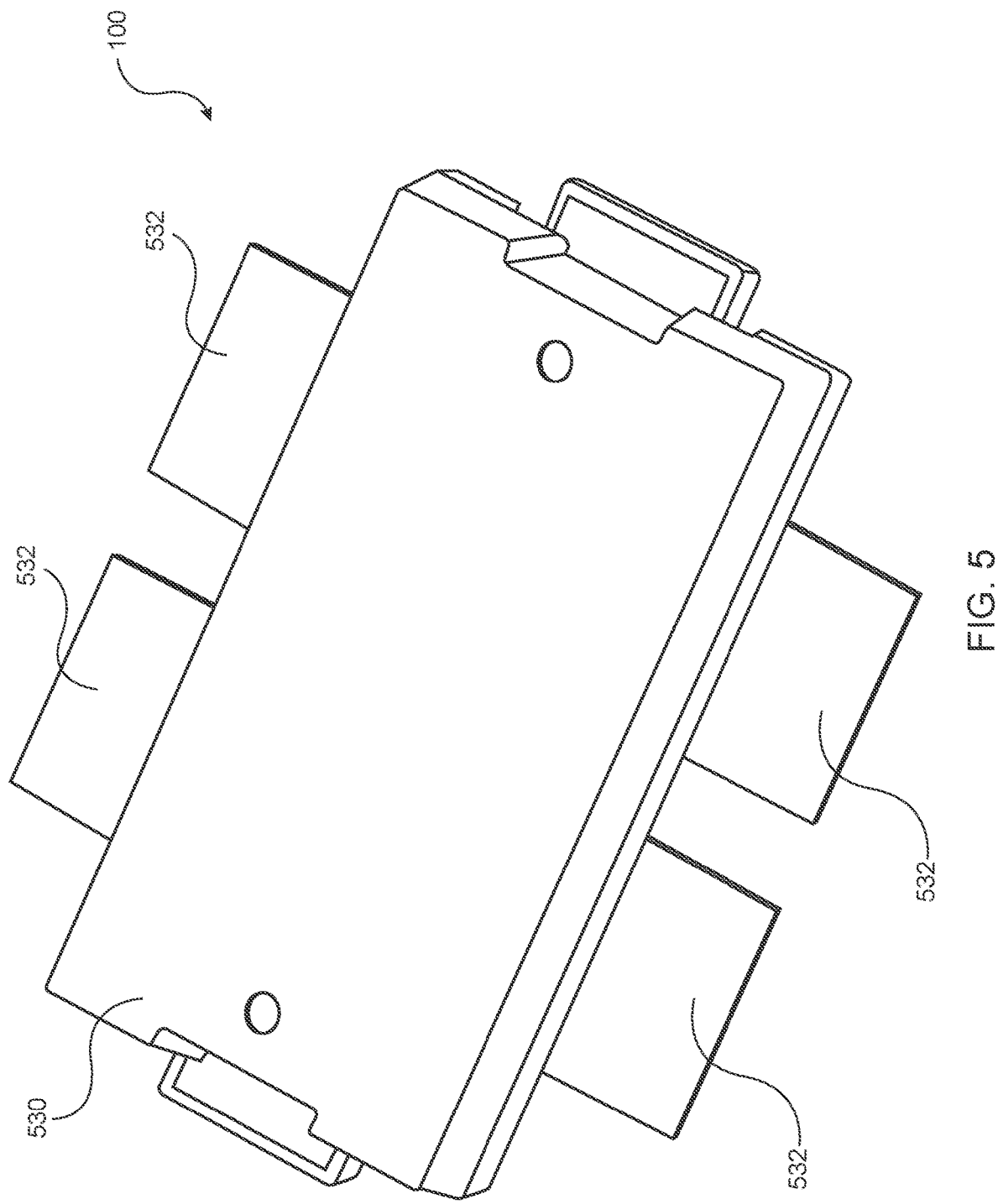
FIG. 5 illustrates a perspective view of a package according to the disclosure.

FIG. 5 illustrates a perspective view of a package according to the disclosure.

Figure 6:
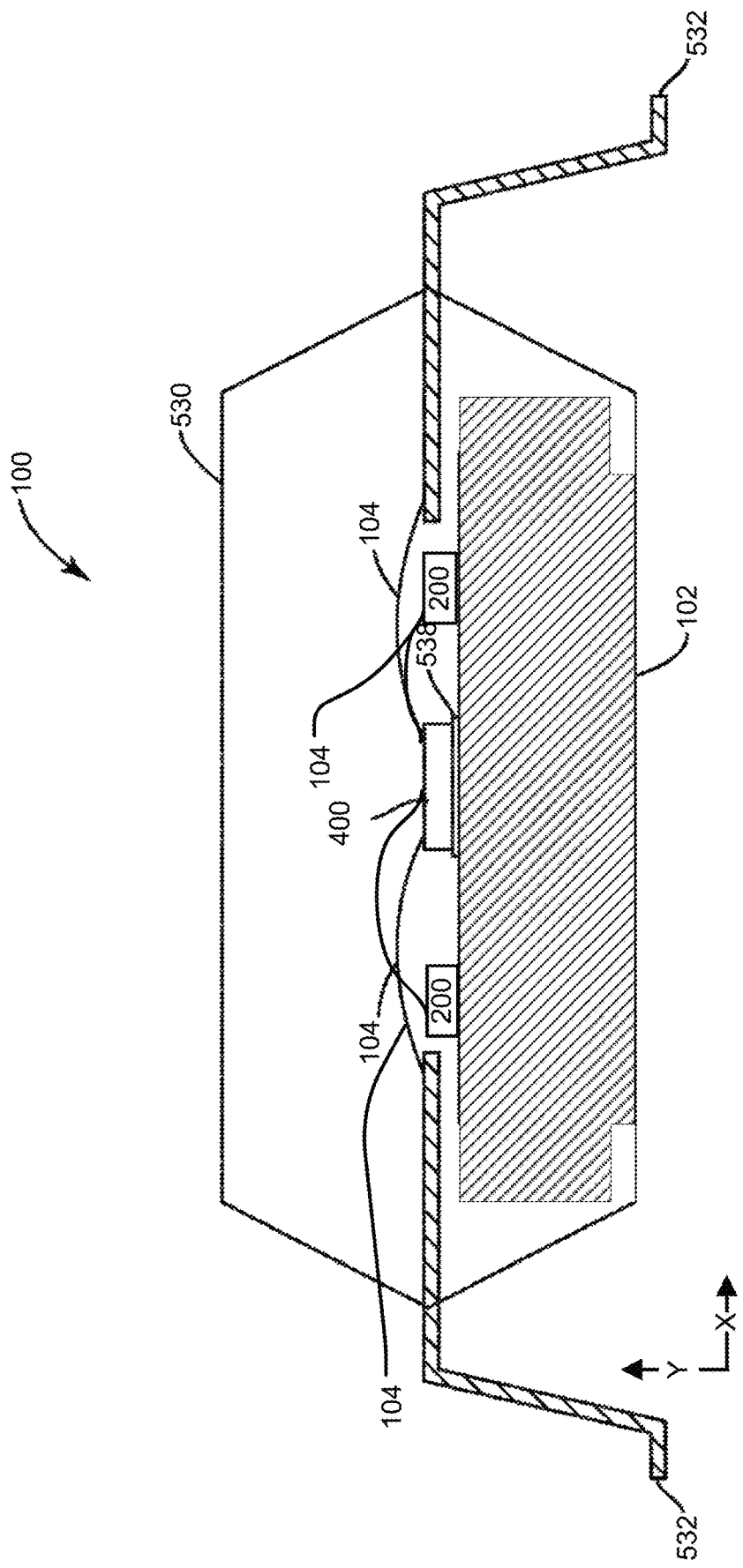
FIG. 6 illustrates a cross-sectional view of the package according to FIG. 5.

FIG. 6 illustrates a cross-sectional view of the package according to FIG. 5.

In particular, FIG. 5 and FIG. 6 show another exemplary implementation of the package 100 that may include any one or more other features, components, arrangements, and the like as described herein. In particular, FIG. 5 and FIG. 6 show the package 100 may be implemented as a RF package, a RF amplifier package, a RF power amplifier package, a RF power transistor package, a RF power amplifier transistor package, and/or the like as described herein. The package 100 may include the one or more semiconductor devices 400, the at least one IPD component 200, and/or the like. As further described herein, the at least one IPD component 200 may be implemented with thermal conductivity, thermal management, and/or the like increasing efficiency, performance, and reliability.

Additionally, inside the package 100, the at least one IPD component 200 may be arranged on the support 102 as described herein with the one or more interconnects 104 shown in an exemplary configuration. The package 100 may include an over-mold 530, one or more input/output pins 532, and the support 102. The over-mold 530 may substantially surround the one or more semiconductor devices 400, which are mounted on the support 102 using a die attach material 538. The over-mold 530 may be formed of a plastic or a plastic polymer compound, which may be injection molded around the support 102, the one or more semiconductor devices 400, the at least one IPD component 200, and/or the like, thereby providing protection from the outside environment. The one or more semiconductor devices 400 and/or the at least one IPD component 200 may be coupled to the one or more input/output pins 532 via the one or more interconnects 104.

In one aspect, the over-mold configuration may substantially surround the one or more semiconductor devices 400, the at least one IPD component 200, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the at least one IPD component 200, and/or the like, thereby providing protection for the at least one IPD component 200, the one or more semiconductor devices 400, and other components of the package 100 from the outside environment.

Figure 7:
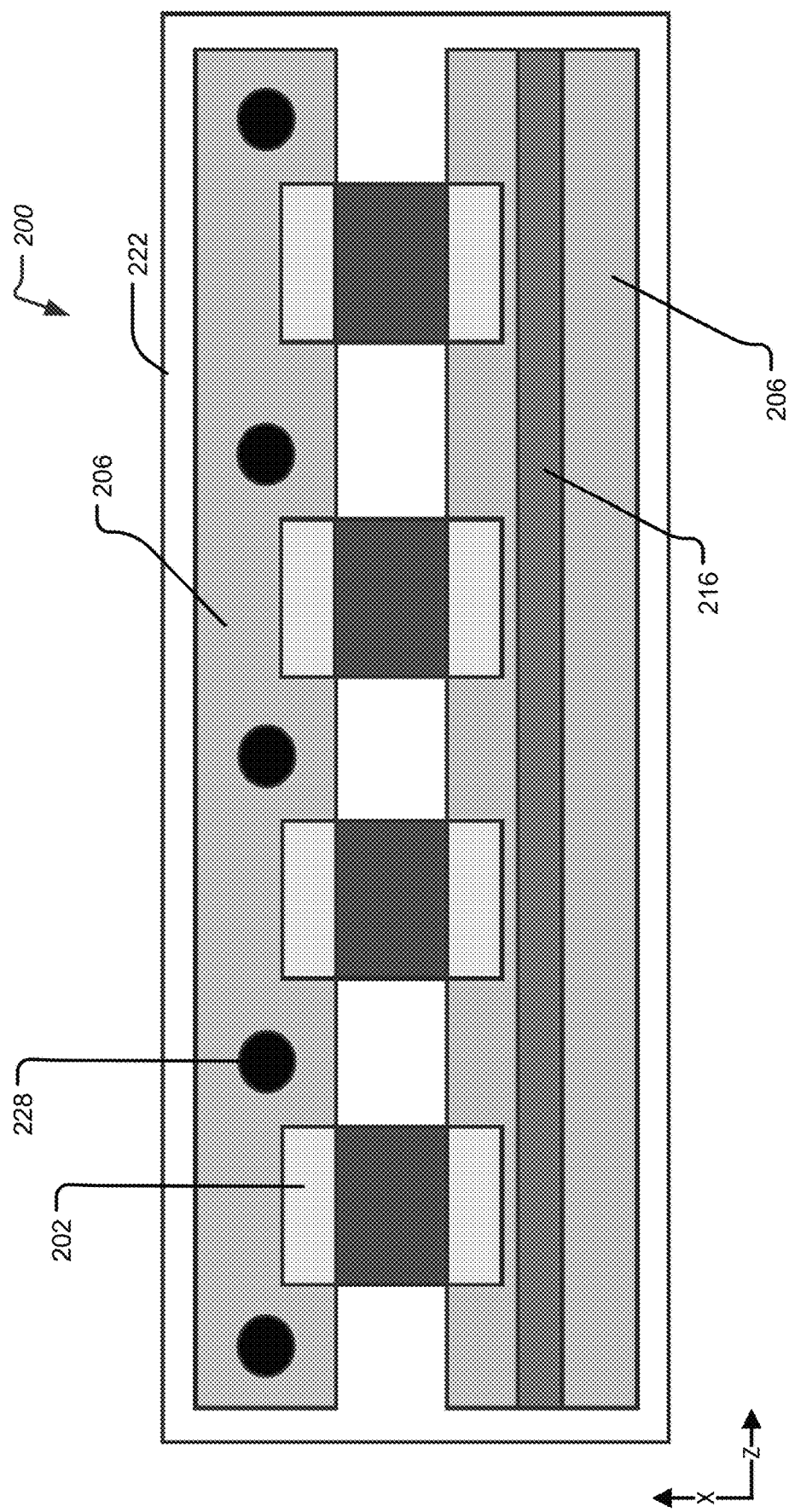
FIG. 7 illustrates a top view of a IPD component according to the disclosure.

FIG. 7 illustrates a top view of a IPD component according to the disclosure.

Figure 8:
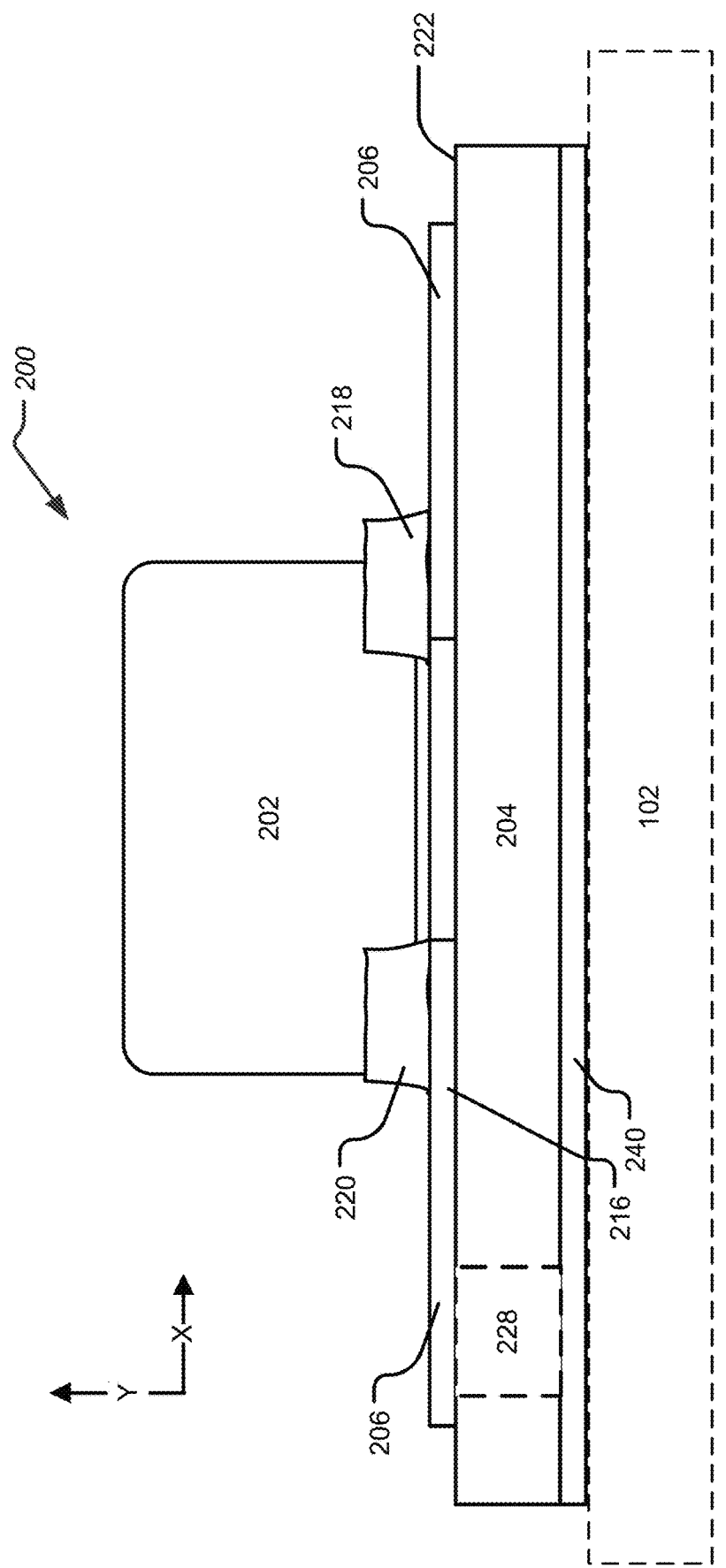
FIG. 8 illustrates a side view of a IPD component according to the FIG. 7.

FIG. 8 illustrates a side view of a IPD component according to the FIG. 7.

In particular, FIG. 7 illustrates the at least one IPD component 200 that may be implemented with thermal conductivity, thermal management, and/or the like increasing efficiency, performance, and reliability. The at least one IPD component 200 of the package 100 may implement at least one device 202. In one aspect, the at least one IPD component 200 of the package 100 may implement a single one of at least one device 202. In one aspect, the at least one IPD component 200 of the package 100 may implement a plurality of the at least one device 202. The at least one IPD component 200 may be implemented as an RF device and the at least one IPD component 200 may connect the at least one device 202 to the package 100, to the one or more semiconductor devices 400, and/or the like. The at least one IPD component 200 may be implemented as a submount for the at least one device 202.

In aspects, RF devices may be configured and implemented in the at least one IPD component 200. In particular, the RF devices may be configured and implemented in the at least one IPD component 200 and may include a GaN based HEMT die, a silicon-based LDMOS transistor die, and/or the like as described herein. The RF devices may include matching networks, harmonic termination circuitry, integrated passive devices (IPD), and the like.

In particular, the RF devices may be configured and implemented in the at least one IPD component 200 as matching networks, harmonic termination circuitry, integrated passive devices (IPD), and the like and may utilize less-expensive ceramic-based surface mount devices (SMDs) that are typically mounted directly to traces on the at least one IPD component 200 to replace the more expensive silicon-based capacitors. In various aspects, the disclosure is directed to mounting the surface mount discrete device(s) (SMDs) onto the at least one IPD component 200 implemented as a submount, which may be mounted on the support 102 such as the metal flange, the metal leadframe, the base, or the like. The submount may be wire bonded or the like to the RF devices such as the dies by input and/or output leads of the RF package, which may be metal based.

FIG. 7 further illustrates that the at least one IPD component 200 may include a plurality interconnect pads 206 and one or more may be configured as an interconnect bond pad. The one or more interconnects 104 may connect to the plurality interconnect pads 206. The one or more interconnects 104 may be implemented as one or more wires, wire bonds, leads, vias, edge platings, circuit traces, tracks, clips, and/or the like. In one aspect, the one or more interconnects 104 may utilize the same type of connection. In one aspect, the one or more interconnects 104 may utilize different types of connections.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to the plurality interconnect pads 206 by an adhesive, soldering, sintering, eutectic bonding, thermal compression bonding, ultrasonic bonding/welding, a clip component, and/or the like as described herein.

With reference to FIG. 8, the at least one IPD component 200 may include a substrate 204. The substrate 204 may include Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material, the substrate 204 may be fabricated as an Alumina substrate, Aluminum Nitride (AlN) substrate, a Beryllium oxide (BeO) substrate, and/or other similar thermal conductivity performance dielectric material substrate, the substrate 204 may comprise Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material. Implementations of the substrate 204 that include Alumina benefit from the high thermal conductivity properties of Alumina (>25 W/m C), which enables the at least one IPD component 200 and the associated IPD components, such as the at least one device 202, to be used for higher power level operation, placed closer to active die, such as the one or more semiconductor devices 400, where there will be high electrical RF currents passing through and generating heat, and/or the like. The substrate 204 implementing Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material results in the IPD components of the at least one IPD component 200, such as the at least one device 202, being able to operate with a lower temperature thus increasing reliability required for 10-20 years life-time operation.

The substrate 204 implementing Alumina substrate (1e14 uOhm-cm), Aluminum Nitride (AlN), and/or other similar thermal conductivity performance dielectric material as described herein may enable the at least one IPD component 200 implementing configurations of the IPD components, such as the at least one device 202 with high Q, low loss, and/or the like thus increasing the efficiency, gain, and/or the like of RF products using these components. Additionally, the substrate 204 implementing Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material as described herein may enable the at least one IPD component 200 implementing configurations of the IPD components, such as the at least one device 202, to have better performance at higher frequencies. Additionally, the substrate 204 implementing an Alumina substrate, Aluminum Nitride (AlN) substrate, Beryllium oxide (BeO) substrate, and/or other similar thermal conductivity performance dielectric material substrate as described herein benefit from a low coefficient of thermal expansion (for Alumina is low 7.0). In this regard, the substrate 204 implementing an Alumina substrate, Aluminum Nitride (AlN) substrate, Beryllium oxide (BeO) substrate, and/or other similar thermal conductivity performance dielectric material substrate makes a good coefficient of thermal expansion match for certain flange applications, such as the support 102, to reduce and/or avoid delamination.

The at least one device 202 may be one or more of a surface mount device (SMD) component, a surface mount device (SMD) capacitor, a ceramic capacitor, a surface mount device (SMD) oscillator, a surface mount device (SMD) ceramic capacitor, an inductor, a surface mount device (SMD) inductor, a resistor, a surface mount device (SMD) resistor, a power divider, a surface mount device (SMD) power divider, a power splitter, a surface mount device (SMD) power splitter, an amplifier, a balanced amplifier, a surface mount device (SMD) amplifier, a surface mount device (SMD) balanced amplifier, a combiner, a surface mount device (SMD) combiner, and/or the like. The at least one device 202 may be implemented as a radio frequency device, a radio frequency circuit device, a radio frequency component device, or the like. The at least one device 202 may be implemented as a radio frequency device, a radio frequency circuit device, a radio frequency component device, or the like may be one or more of a surface mount device (SMD) radio frequency component, a surface mount device (SMD) radio frequency capacitor, a radio frequency ceramic capacitor, a surface mount device (SMD) oscillator, a surface mount device (SMD) radio frequency ceramic capacitor, a radio frequency inductor, a surface mount device (SMD) radio frequency inductor, a radio frequency resistor, a surface mount device (SMD) radio frequency resistor, a radio frequency power divider, a surface mount device (SMD) radio frequency power divider, a radio frequency power splitter, a surface mount device (SMD) radio frequency power splitter, a radio frequency amplifier, a balanced radio frequency amplifier, a surface mount device (SMD) radio frequency amplifier, a surface mount device (SMD) radio frequency balanced amplifier, a radio frequency combiner, a surface mount device (SMD) radio frequency combiner, a surface mount device (SMD) resistor, a surface mount device (SMD) resistor providing tuning, stability, and baseband impedance, and/or the like.

The package 100 may be implemented as an RF package and the at least one device 202 may be implemented as a radio frequency device may include, connect, support, or the like a transmitter, transmitter functions, a receiver, receiver functions, a transceiver, transceiver functions, matching network functions, harmonic termination circuitry, integrated passive devices (IPD), and the like. The at least one device 202 implemented as a radio frequency device may be configured to, may support, or the like transmitting a radio wave and modulating that wave to carry data with allowable transmitter power output, harmonics, and/or band edge requirements. The at least one device 202 implemented as a radio frequency device may be configured to, may support, or the like receiving a radio wave and demodulating the radio wave. The at least one device 202 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

With reference to FIG. 8, the substrate 204 may include an upper surface 222. The upper surface 222 may be located in a plane generally parallel to the x-axis or a plane generally parallel to the upper surface of the support 102. In this regard, generally may be defined to be within 0°-15°, 0°-2°, 2°-4°, 4°-6°, 6°-8°, 8°-10°, 10°-12°, or 12°-15°. The upper surface 222 may support the plurality interconnect pads 206. The plurality interconnect pads 206 may include multiple bond pad areas. The plurality interconnect pads 206 may be formed by a metal surface on the upper surface 222 of the substrate 204 and may comprise a metallic material such as copper, gold, nickel, palladium, silver, and the like, and combinations thereof.

In some aspects, the at least one device 202 may include terminals arranged on a bottom surface. Accordingly, directly mounting a device such as the at least one device 202 to the support 102 of the package 100 would result in a short. For example, the at least one device 202 implemented as a surface mount device (SMD) component, such as a surface mount device (SMD) ceramic capacitor, may include one or more terminals arranged on a bottom surface of the surface mount device (SMD) component. Accordingly, mounting the at least one device 202 configured as a surface mount device (SMD) component to the support 102 of the package 100 would result in a short.

Accordingly, the disclosure utilizes the substrate 204 of the at least one IPD component 200 to support the at least one device 202. The substrate 204 may be mounted on an upper surface of the support 102. The substrate 204 may be mounted on the upper surface of the support 102 by an adhesive, soldering, sintering, eutectic bonding, ultrasonically welding, and/or the like as described herein. In one aspect, the substrate 204 may be directly mounted on the upper surface of the support 102. In one aspect, the substrate 204 may be mounted on the upper surface of the support 102 with intervening structures, components, and/or the like. The upper surface of the support 102 may be parallel to an x-axis; and the substrate 204 may be arranged vertically above the support 102 along a y-axis as illustrated in FIG. 2 and FIG. 6. In one aspect, the substrate 204 may be at least partially insulating. More specifically, the substrate 204 may at least partially insulate the at least one device 202 from the support 102.

Referring back to FIG. 7, one or more of the plurality interconnect pads 206 may be surfaces for bonding to the one or more interconnects 104. Accordingly, it may be beneficial to ensure that the surfaces of the plurality interconnect pads 206 remain clean. In particular, attachment of the at least one device 202 to the plurality interconnect pads 206 may result in solder transferring to other surfaces of the plurality interconnect pads 206. Accordingly, as shown in FIG. 7, the plurality interconnect pads 206 may include a solder barrier 216 arranged between various bond areas of the one or more interconnects 104 to the plurality interconnect pads 206 and the bond areas of the at least one device 202 to the plurality interconnect pads 206.

The upper surface 222 may further implement the plurality interconnect pads 206 as a first terminal bond pad. The first terminal bond pad may be located in a plane generally parallel to the x-axis or a plane generally parallel to the upper surface 222. The first terminal bond pad may connect to a first terminal of the at least one device 202. In this regard, a first connection 220 may be formed between the first terminal bond pad and the first terminal. The first connection 220 may include an adhesive, soldering, sintering, eutectic bonding, ultrasonically welding, and/or the like as described herein. The first terminal bond pad may be formed by a metal surface on the upper surface 222 of the substrate 204 and may comprise a metallic material such as copper, gold, nickel, palladium, silver, and the like, and combinations thereof.

The upper surface 222 may further implement another one of the plurality interconnect pads 206 as a second terminal bond pad. The second terminal bond pad may be located in a plane generally parallel to the x-axis or a plane generally parallel to the upper surface 222. The second terminal bond pad may connect to a second terminal of the at least one device 202. In this regard, a second connection 218 may be formed between the second terminal bond pad and the second terminal. The second terminal bond pad may be electrically connected in part to the plurality interconnect pads 206. The second connection 218 may include an adhesive, soldering, sintering, eutectic bonding, ultrasonically welding, and/or the like as described herein. The second terminal bond pad may be formed by a metal surface on the upper surface 222 of the substrate 204 and may comprise a metallic material such as copper, gold, nickel, palladium, silver, and the like, and combinations thereof. Additionally, the upper surface 222 of the substrate 204 may include additional terminals for the at least one device 202 as needed.

The at least one IPD component 200 may include a metallization layer 240 located on a lower surface of the substrate 204 opposite the upper surface 222. The metallization layer 240 may be located in a plane generally parallel to the x-axis or a plane generally parallel to the upper surface 222. In one aspect, the metallization layer 240 may be implemented as a full face metallic layer on the lower surface of the substrate 204 opposite the upper surface 222. Additionally or alternatively, the at least one IPD component 200 may be single-sided having one metallic layer; the at least one IPD component 200 may be double-sided having two metallic layers on both sides of one substrate layer of the substrate 204; and/or the at least one IPD component 200 may be multi-layer having outer and inner layers of aluminum, copper, silver, gold, and/or the like, alternating with layers of substrate. The at least one IPD component 200 may include separate conducting lines, tracks, circuit traces, pads for connections, vias to pass connections between layers of aluminum, copper, silver, gold, and/or the like, and features such as solid conductive areas for EM shielding or other purposes.

Additionally or alternatively the at least one IPD component 200 may include conductors on different layers that may be connected with vias, which may be metallic plated holes, such as copper-plated holes, aluminum-plated holes, silver-plated holes, gold-plated holes, and/or the like, that may function as electrical tunnels through the dielectric substrate. The at least one IPD component 200 may include "Through hole" components that may be mounted by their wire leads passing through the substrate 204 and soldered to traces on the other side. The at least one IPD component 200 may include "Surface mount" components that may be attached by their leads and/or terminals.

The at least one IPD component 200 and/or the metallization layer 240 may be manufactured utilizing one or more manufacturing techniques including print screening or dispensing for solder paste, print screening or dispensing for epoxy, silk screen printing processes, photoengraving processes, print onto transparent film processes, photo mask processes, photo-sensitized board processes, laser resist ablation processes, milling processes, laser etching processes, and/or like processes. In one or more aspects, the at least one IPD component 200 may be configured to mechanically support and electrically connect the at least one device 202 to the at least one IPD component 200 and other electronic components.

Additionally, the at least one IPD component 200 may include vias 228. The vias 228 may extend from the plurality interconnect pads 206 to the metallization layer 240. Accordingly, a terminal of the at least one device 202 may connect through the first connection 220 to the first terminal bond pad through the vias 228 at least to the metallization layer 240 to make an electrical connection and/or electrical contact with the support 102. The vias 228 may also extend through the metallization layer 240 to the support 102 to make an electrical connection and/or electrical contact with the support 102. In other aspects, the vias 228 may only be implemented as partial vias. The vias 228 may be metallic plated holes or metallic filled holes that may function as electrical tunnels through the substrate 204. The vias 228 may comprise a metallic material such as copper, gold, nickel, palladium, silver, and the like, and combinations thereof. The vias 228 may have an axis that may be located in a plane generally perpendicular to the x-axis, a plane generally parallel to the x-axis, and/or a plane generally perpendicular to the upper surface 222.

In a particular aspect, a first embodiment of the at least one IPD component 200 shown in FIG. 7, where a plurality of the at least one device 202 implemented as SMD capacitors are arranged on an Alumina substrate implementation of the substrate 204. One end of the SMD capacitors may be electrically connected to a conductive trace implemented by the plurality interconnect pads 206 which connects to a bond pad. Bond wires such as the one or more interconnects 104 can be attached to the bond-pad implemented by the plurality interconnect pads 206 for connecting the at least one IPD component 200 to other components in the package 100. A thin strip of solder mask implemented by the solder barrier 216 may protect the bond pad from solder contamination during reflow attach of the SMD component. The other end of the SMD capacitors may be electrically connected to ground (back-side of the at least one IPD component 200) through a conductive trace and/or the vias 228, the metallization layer 240, and/or the like.

Figure 9:
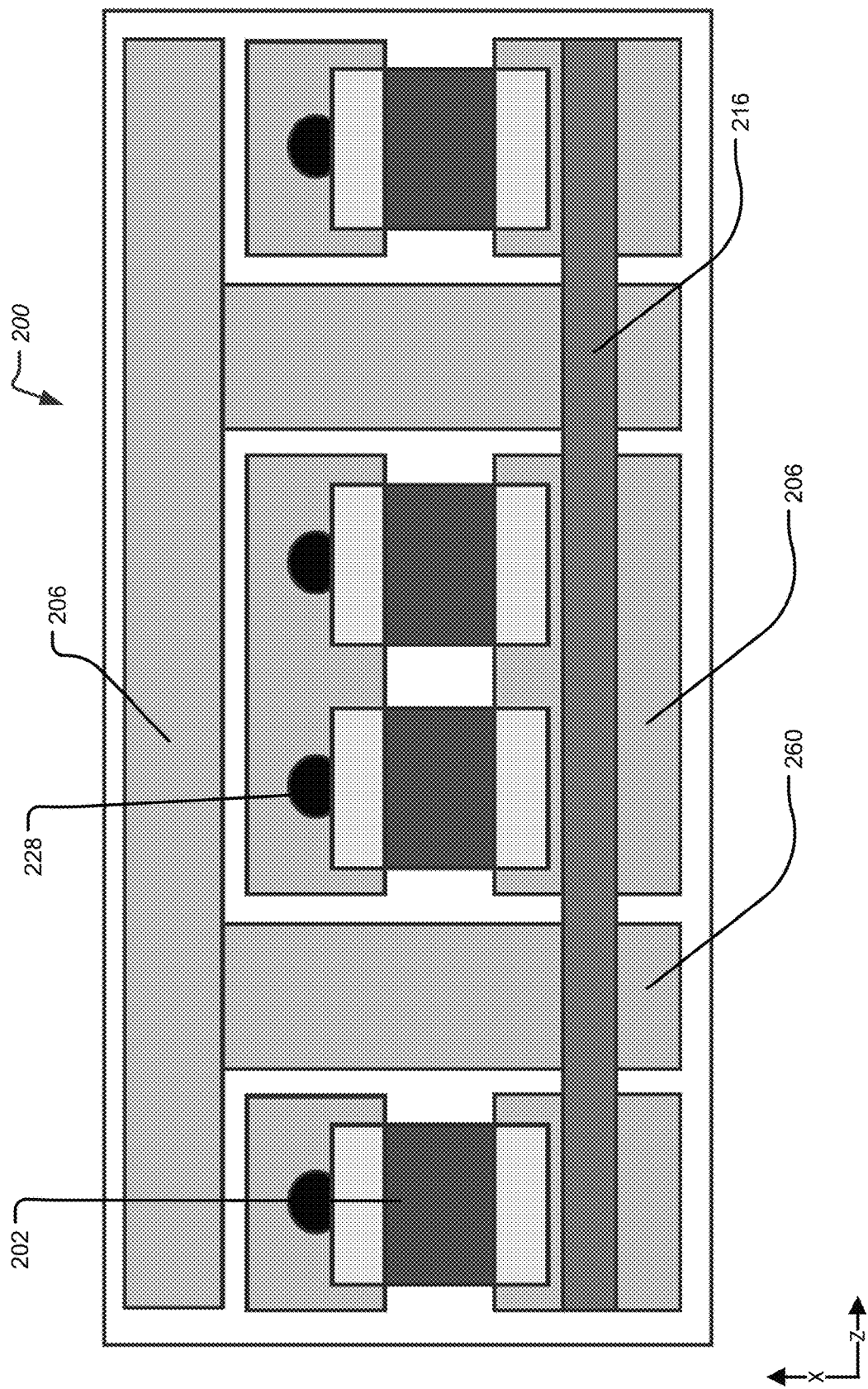
FIG. 9 illustrates a top view of another IPD component according to the disclosure.

FIG. 9 illustrates a top view of another IPD component according to the disclosure.

In particular, FIG. 9 illustrates the at least one IPD component 200 that may include any and all features, configurations, arrangements, implementations, aspects and/or the like as described herein. Additionally, FIG. 9 illustrates that the at least one IPD component 200 may include a circuit structure 260. In particular, the circuit structure 260 may be arranged adjacent to the at least one device 202 and may be configured to provide an inductance, capacitance, resistance, and/or the like. In one aspect, the circuit structure 260 may be a metallic surface arranged on the upper surface 222 and together with the metallization layer 240, may create a capacitor. Additionally, the circuit structure 260 may be configured as inductive strips, inductive coils, capacitive stubs, and/or the like. In one aspect, the circuit structure 260 may implement a resistor such as a thin film resistor, a thick film resistor, a printed thin film resistor, a printed thick film resistor, and/or the like that may be arranged on the at least one IPD component 200, printed on the at least one IPD component 200 and/or the like.

In one aspect, the circuit structure 260 may be implemented as an open ended shunt stub. In this regard, the circuit structure 260 may be configured using a top metallization on the upper surface 222 on the substrate 204, with the dielectric of the substrate 204 and the bottom metallization implemented by the metallization layer 240 creating capacitance. As illustrated in FIG. 9, the plurality interconnect pads 206 implementing an open ended shunt stub may be inter-spaced between the at least one device 202 to form low value capacitances suitable for second harmonic or third harmonic optimization for the one or more semiconductor devices 400. The plurality interconnect pads 206 implementing the harmonic shunt stubs may be arranged on the at least one IPD component 200 so that there may be one stub available for each of the one or more semiconductor devices 400. Additional capacitance areas may be created using a large continuous rectangular area implementation of the circuit structure 260 connected to the shunt stubs and located behind a row of the vias 228.

Referring back to FIG. 4, the package 100 of FIG. 4 illustrates implementation of the at least one IPD component 200 illustrated in FIG. 7 together with an implementation of the at least one IPD component 200 illustrated in FIG. 9. In particular, FIG. 7 illustrates the package 100 implementing the FIG. 4 embodiment of the at least one IPD component 200 and the FIG. 7 embodiment of the at least one IPD component 200 being used together with the one or more semiconductor devices 400 such as an active die, which may for example be a GaN die, in a packaged RF power product. The FIG. 7 embodiment of the at least one IPD component 200 may be used in the output pre-match to form the capacitance in a shunt L-C network, and the FIG. 4 embodiment of the at least one IPD component 200 may be used to form the prematch in a low-pass L-C network on the input. The open-ended stubs together with the one or more interconnects 104, such as wire-bonds to each tub of the one or more semiconductor devices 400, may be configured to present the optimum second harmonic impedance at the input to the one or more semiconductor devices 400 to enable higher efficiency.

Figure 10:
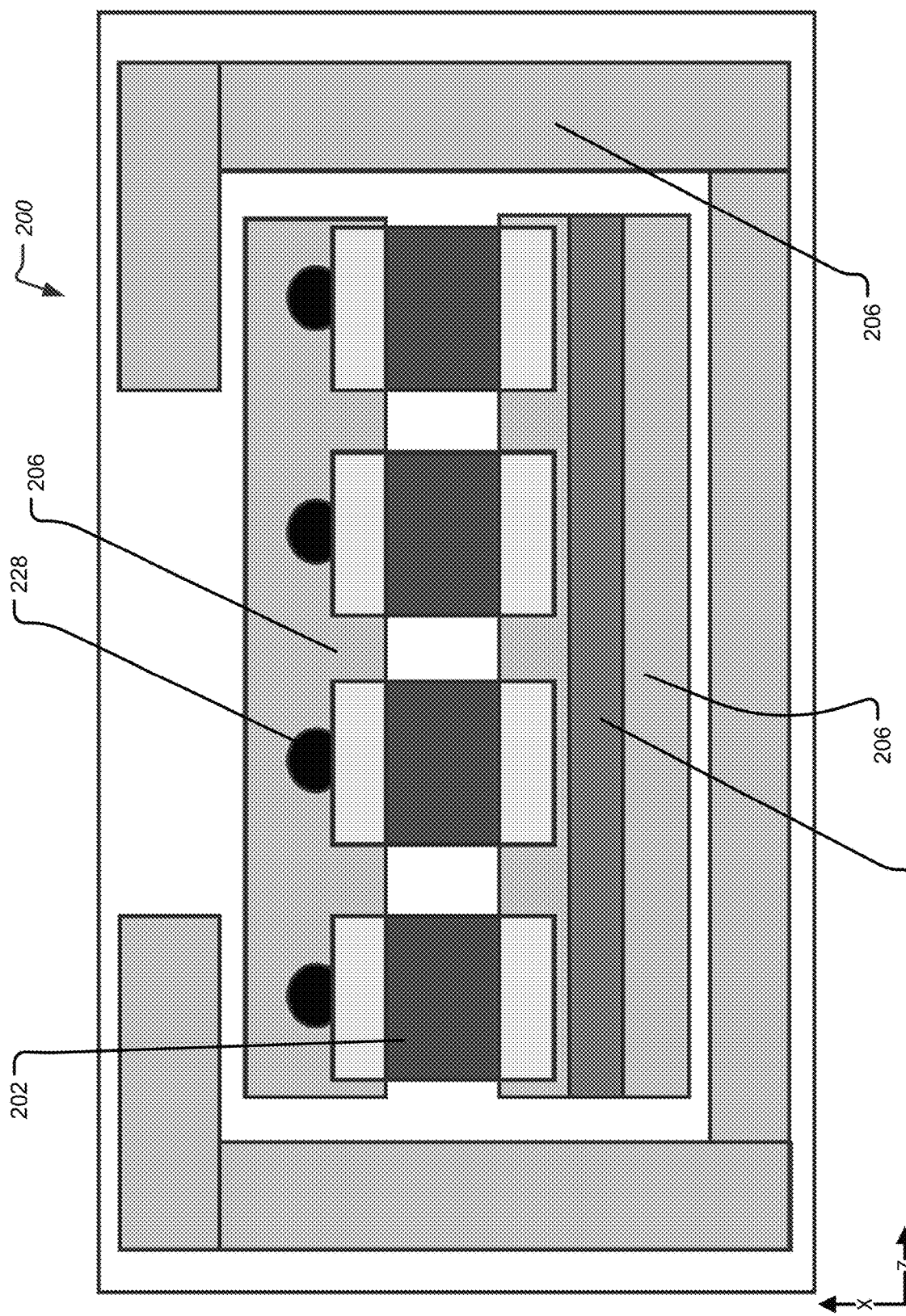
FIG. 10 illustrates a top view of another IPD component according to the disclosure implemented.

FIG. 10 illustrates a top view of another IPD component according to the disclosure implemented.

In particular, FIG. 10 illustrates the at least one IPD component 200 that may include any and all features, configurations, arrangements, implementations, aspects and/or the like as described herein. Additionally, FIG. 10 illustrates that the at least one IPD component 200 may include a configuration of the plurality interconnect pads 206 that may be is routed along outer edges of the at least one IPD component 200 and may also continue behind the at least one device 202. In this regard, the plurality interconnect pads 206 may be configured as a thin and meandering line; or the plurality interconnect pads 206 may be implemented as a wider and shorter line to provide the desired circuit. The various implementations of the plurality interconnect pads 206 of FIG. 10 may give more flexibility to manipulate the impedance presented at the harmonic frequencies. Additionally, the FIG. 10 embodiment can work with the one or more semiconductor devices 400 with a different number of tubs since the bond-pads implemented by the plurality interconnect pads 206 may be continuous across the width of the die. Referring back to FIG. 3, the package 100 is shown implementing the FIG. 10 aspect of the at least one IPD component 200 on the input or right side of the package 100.

Figure 11:
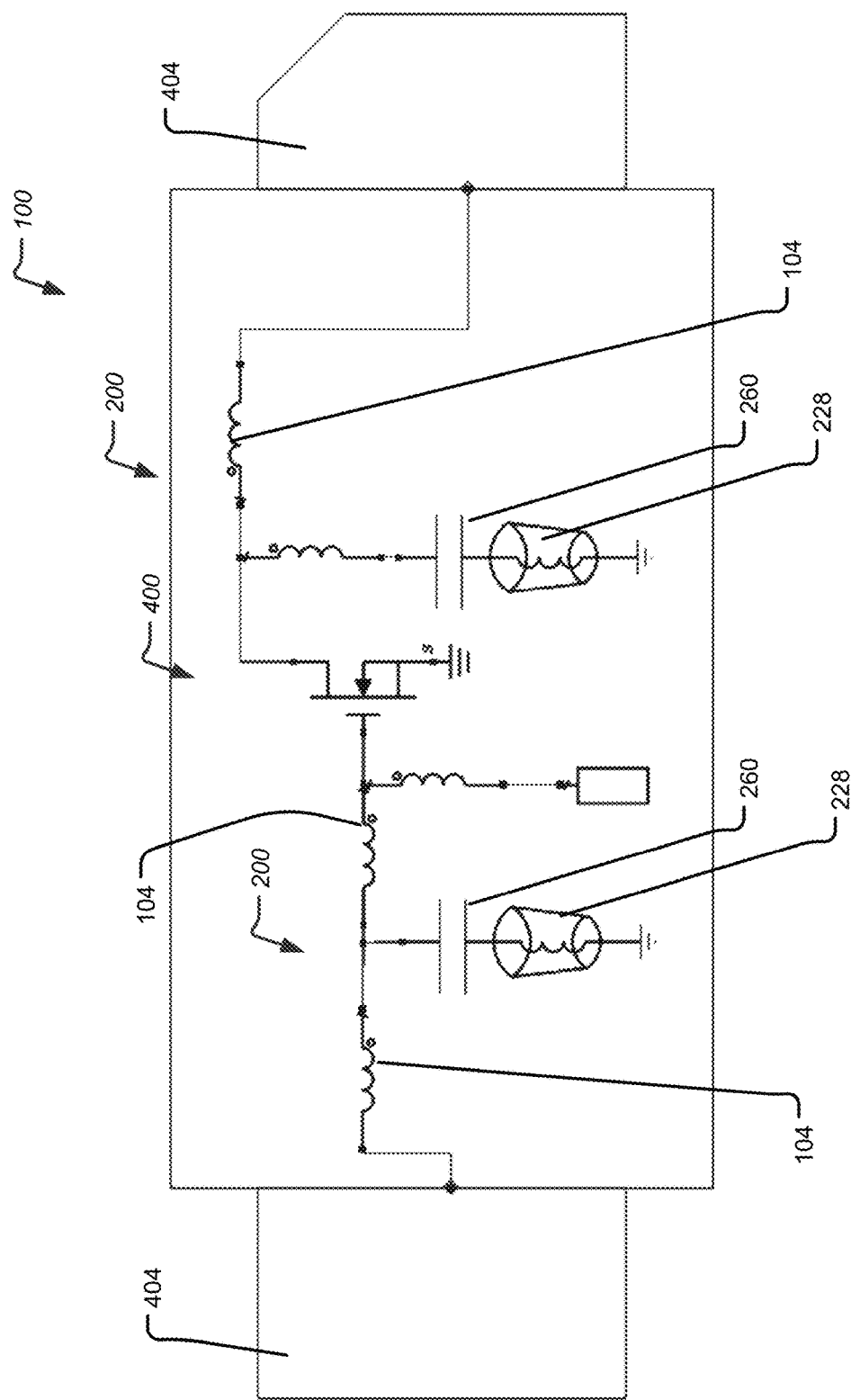
FIG. 11 illustrates an equivalent circuit for a package according to the disclosure.

FIG. 11 illustrates an equivalent circuit for a package according to the disclosure.

In particular, FIG. 11 illustrates an equivalent circuit design that represents the topologies shown in FIG. 10 and FIG. 11. On the output or left side, the one or more interconnects 104, such as wire-bonds, and the at least one IPD component 200 implementing the at least one device 202, such as SMD caps, form a shunt L-C network. The one or more interconnects 104, such as wire bonds, going from the one or more semiconductor devices 400, and over the at least one IPD component 200, and connecting directly to the one or more metal contacts 404 implemented as an output RF lead for a series inductor. On the input side or right side, the at least one IPD component 200 may be configured with the circuit structure 260 implementing open ended shunt stubs or low capacitance formed by top and bottom metal of the substrate. Additionally, the one or more interconnects 104 implemented as the wire-bonds may connect to the one or more semiconductor devices 400 and may form a shunt—LC or shunt open stub. This aspect may be used to optimize the harmonic impedance present to the input of the one or more semiconductor devices 400 and can be used to optimize the efficiency and linearity of the package 100. A low-pass L-C-L network may be made by the one or more interconnects 104, such as the wire-bonds, and the at least one device 202, such as SMD caps, then may connect between the one or more semiconductor devices 400 and an RF input lead.

Figure 12:
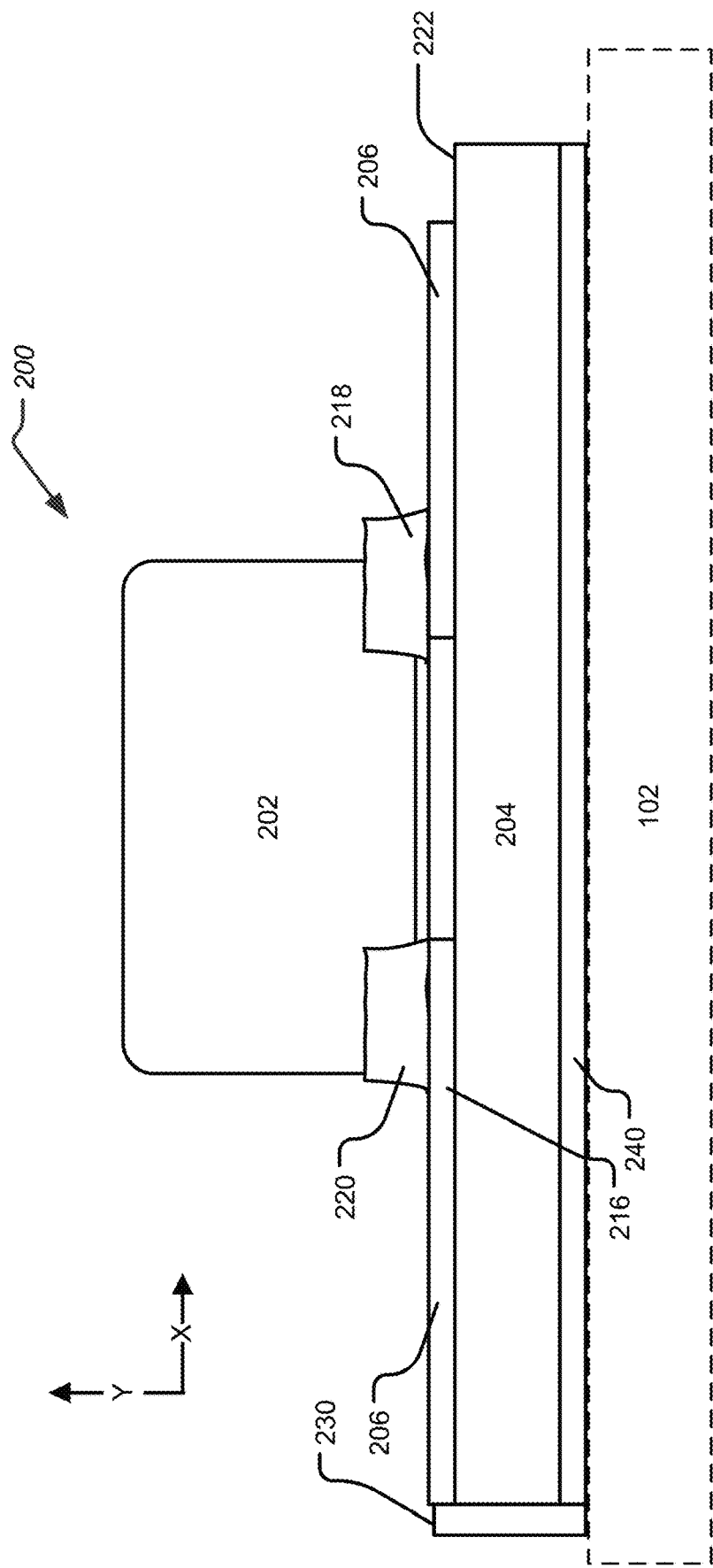
FIG. 12 illustrates a side view of another IPD component according to the disclosure.

FIG. 12 illustrates a side view of another IPD component according to the disclosure.

In particular, FIG. 12 illustrates the at least one IPD component 200 that may include any and all features, configurations, arrangements, implementations, aspects and/or the like as described herein. Additionally, FIG. 12 illustrates that the at least one IPD component 200 may include edge plating 230. The edge plating 230 may extend from the upper surface 222 and/or the plurality interconnect pads 206 to the metallization layer 240. The edge plating 230 may be located in a plane generally perpendicular to the x-axis or a plane generally perpendicular to the upper surface 222. Accordingly, a terminal of the at least one device 202 may connect through the first connection 220 through the edge plating 230 at least to the metallization layer 240 to make an electrical connection and/or electrical contact with the support 102. The edge plating 230 may also extend to the metallization layer 240 to the support 102 to make an electrical connection and/or electrical contact with the support 102. The edge plating 230 may include a metallic material such as copper, gold, nickel, palladium, silver, and the like, and combinations thereof. In one or more aspects, the edge plating 230 may include routing and plated constellation configurations and/or long-hole configurations also called castellation or edge plating. In one or more aspects, the edge plating 230 may further reduce cost in comparison to utilizing vias as vias may at times become plugged.

Figure 13A:
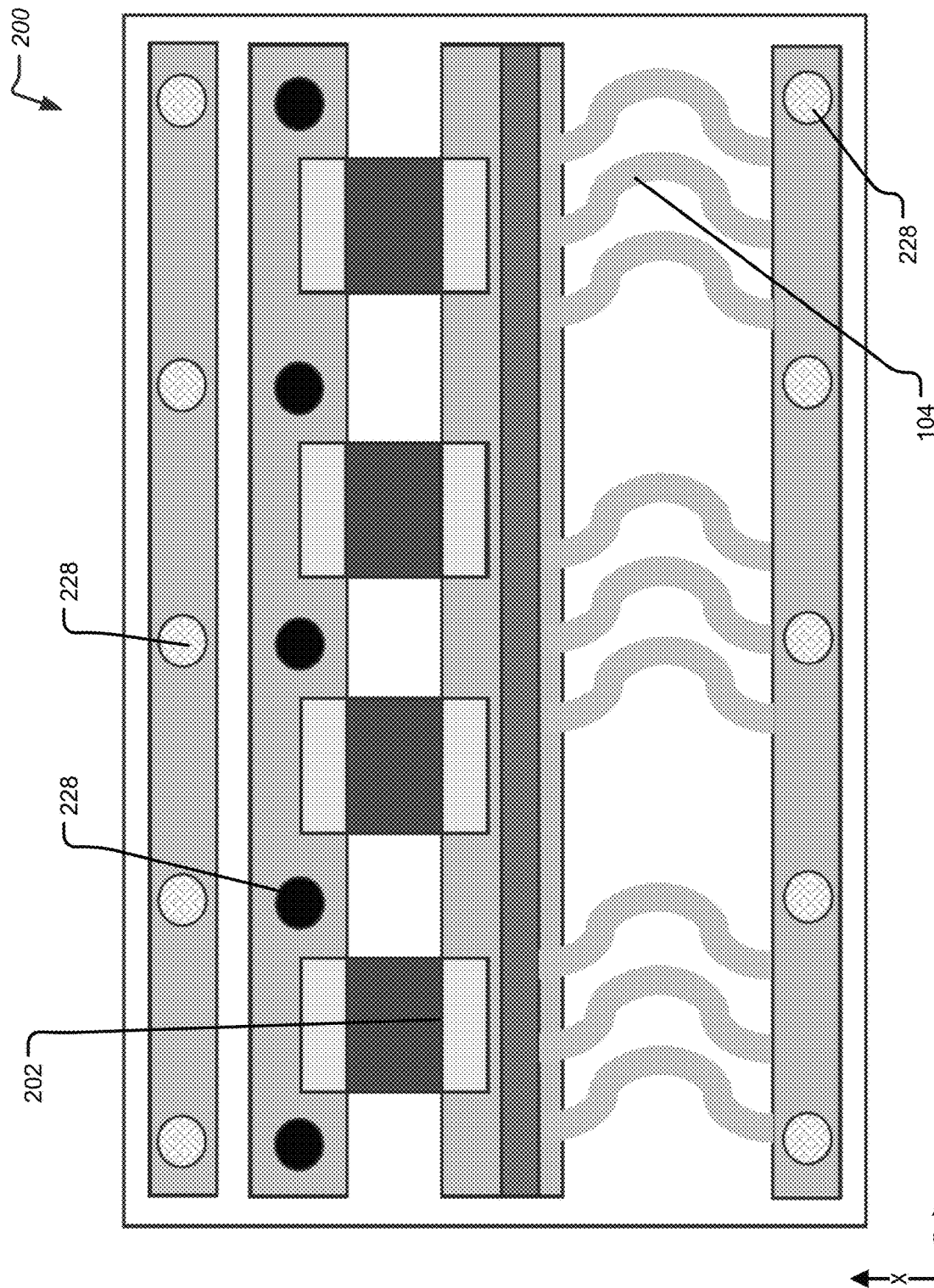
FIG. 13 includes FIG. 13a that illustrates a top view of another IPD component according to the disclosure implemented.
FIG. 13b illustrates a metal layer view of another IPD component.
FIG. 13c illustrates a bottom metal layer view.
FIG. 13d illustrates a cross-sectional view.
Figure 13B:
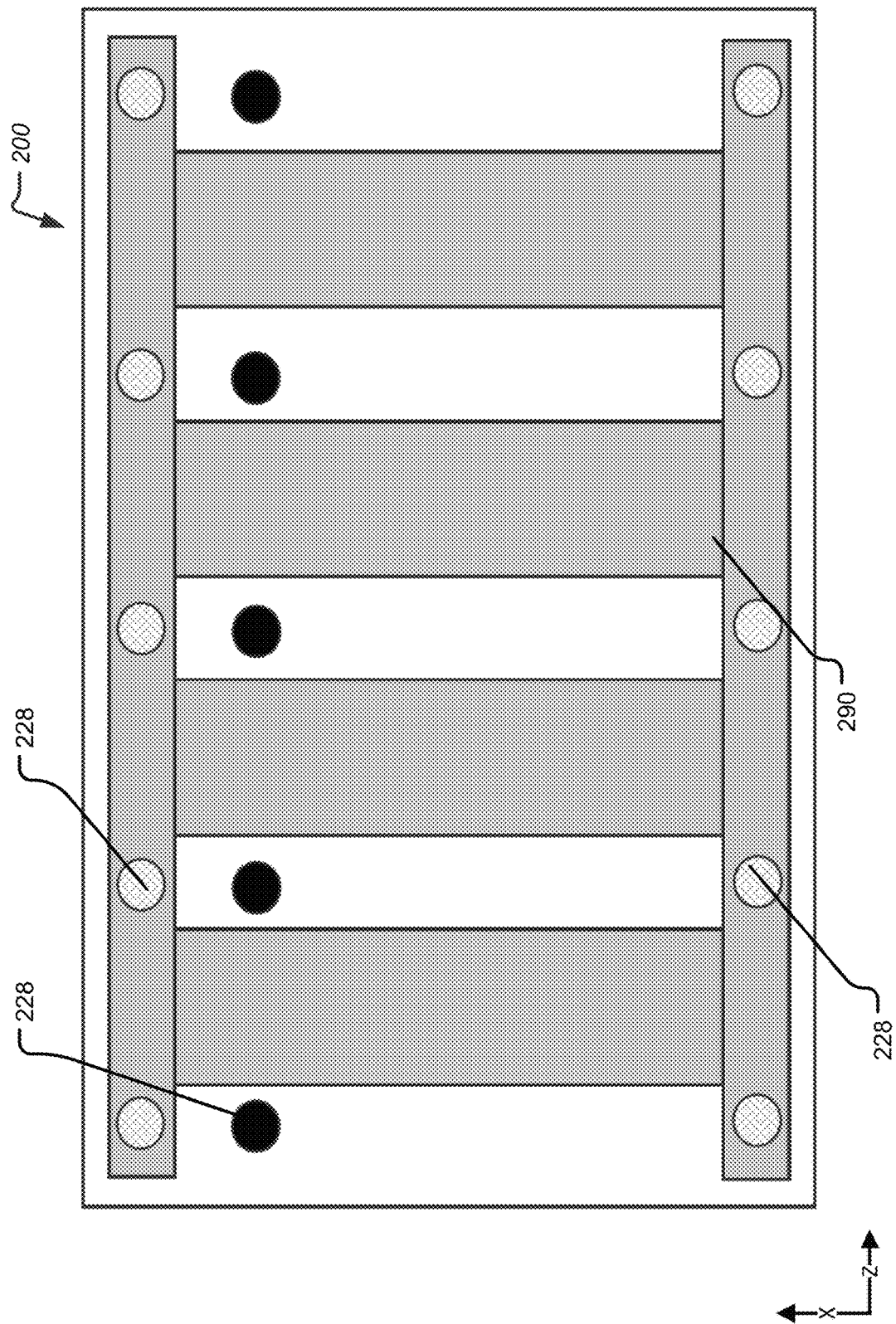
Figure 13C:
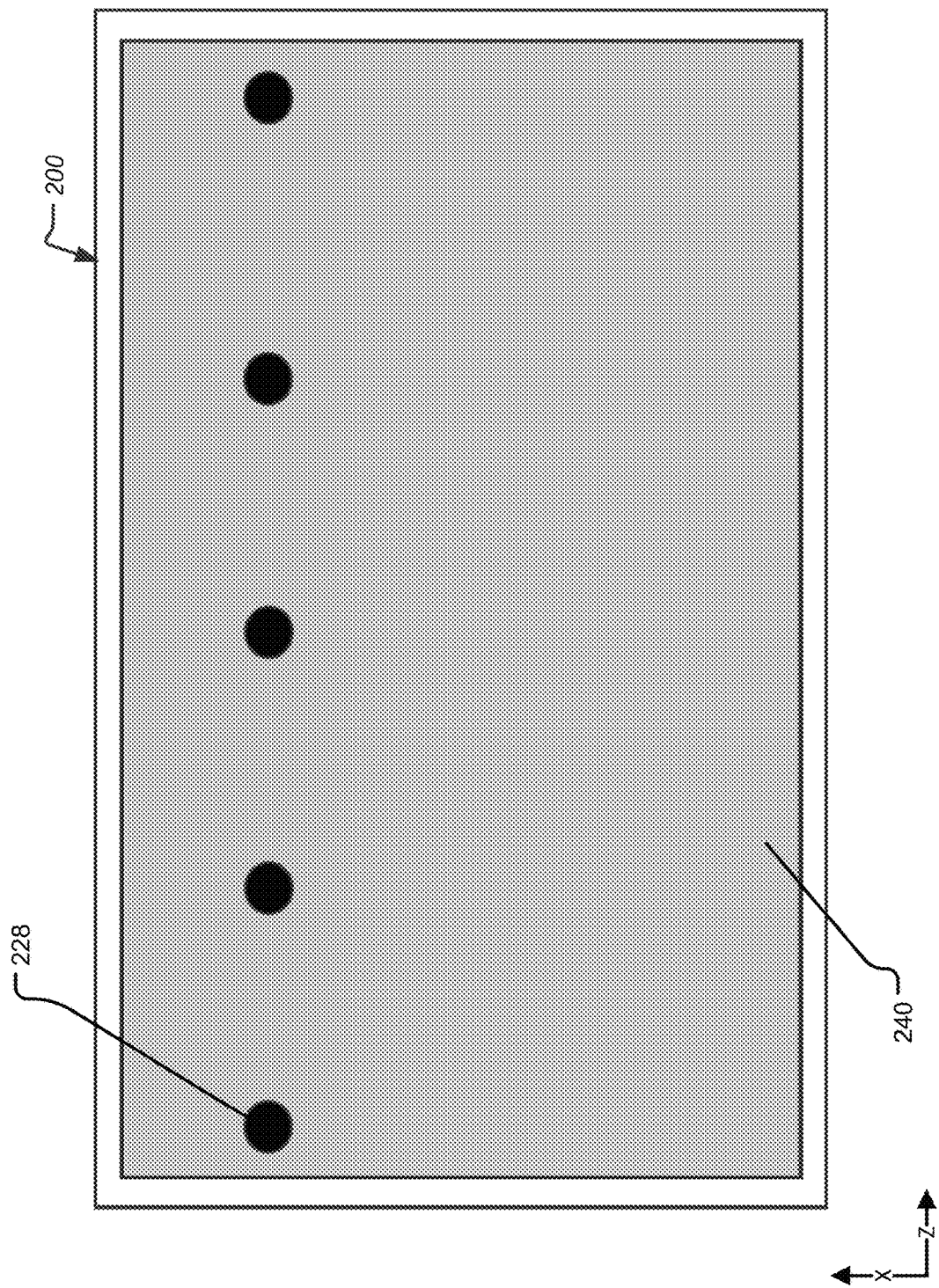
Figure 13D:
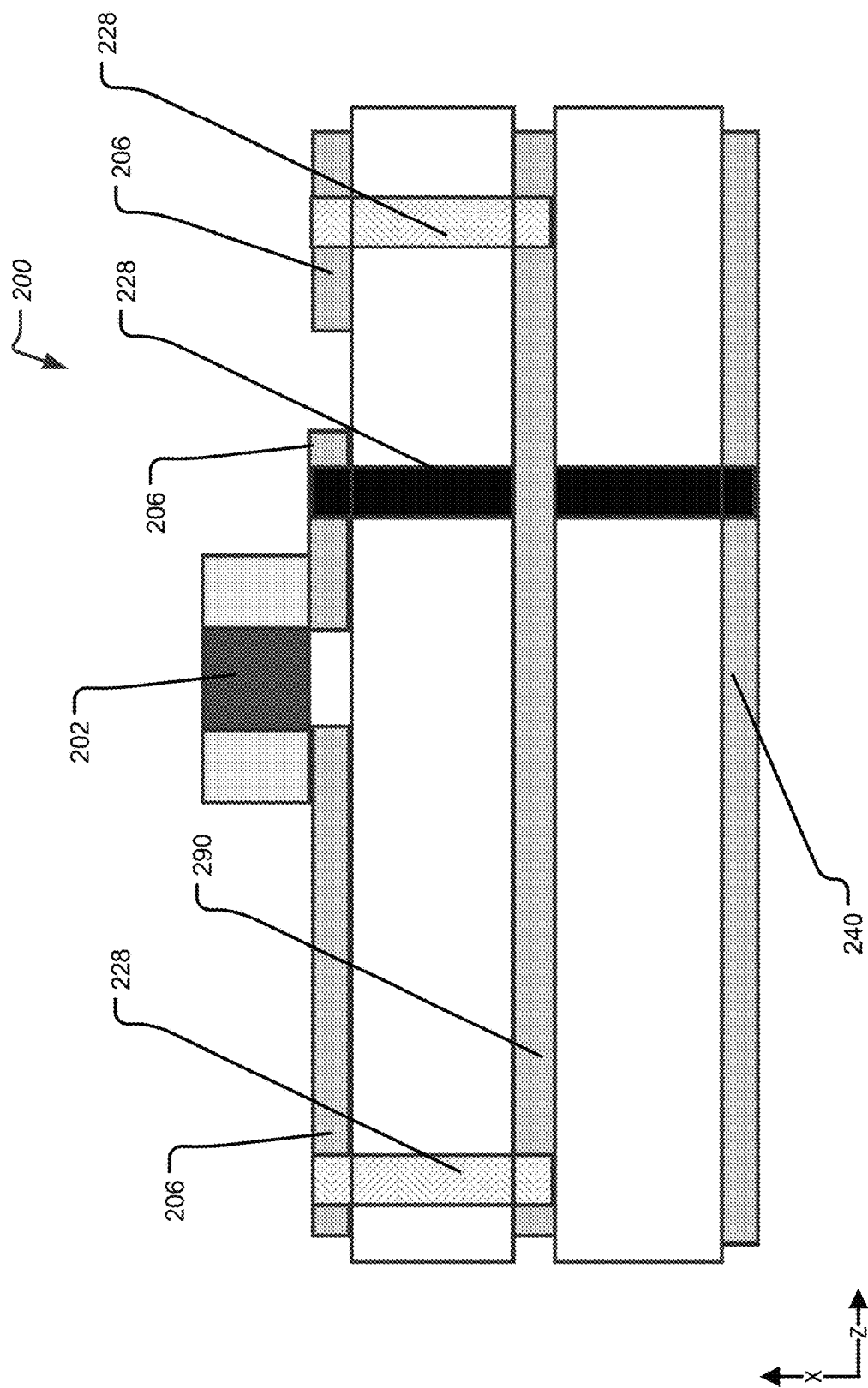

FIG. 13 includes FIG. 13a that illustrates a top view of another IPD component according to the disclosure implemented, FIG. 13b illustrates a metal layer view of another IPD component, FIG. 13c illustrates a bottom metal layer view, and FIG. 13d illustrates a cross-sectional view.

In particular, FIG. 13 illustrates the at least one IPD component 200 that may include any and all features, configurations, arrangements, implementations, aspects and/or the like as described herein. Additionally, FIG. 13 illustrates that the at least one IPD component 200 may be implemented as a multi-layer substrate. In particular, the at least one IPD component 200 of FIG. 13 may include 3 metal layers and 2 dielectric layers. But similar features can be applied to any type of multi-layer stack up. The plurality interconnect pads 206 may be configured as an output shunt-LC made with the top metal layer traces and the at least one device 202 implemented as SMD capacitors as shown in FIG. 13a. One end of the at least one device 202 that may be implemented as SMD capacitors may be routed to the metallization layer 240 or ground layer by the vias 228 connecting the top metal layer of the at least one device 202 all the way to the metallization layer 240 or bottom metal layer.

The at least one IPD component 200 of FIG. 13 may implement an output series inductance by implementing a second metal layer as shown in FIG. 13b. The metal layer 290 illustrated in FIG. 13b may route back up to the top layer of the at least one IPD component 200 for connection with the plurality interconnect pads 206 implemented as bond-pads and wirebonds, and in one aspect may be implemented with the vias 228 implemented with partial/blind vias connecting just the top two layers of the at least one IPD component 200. The cross-section of an example multi-layer stack-up of the at least one IPD component 200 is shown in FIG. 13d.

Figure 14:
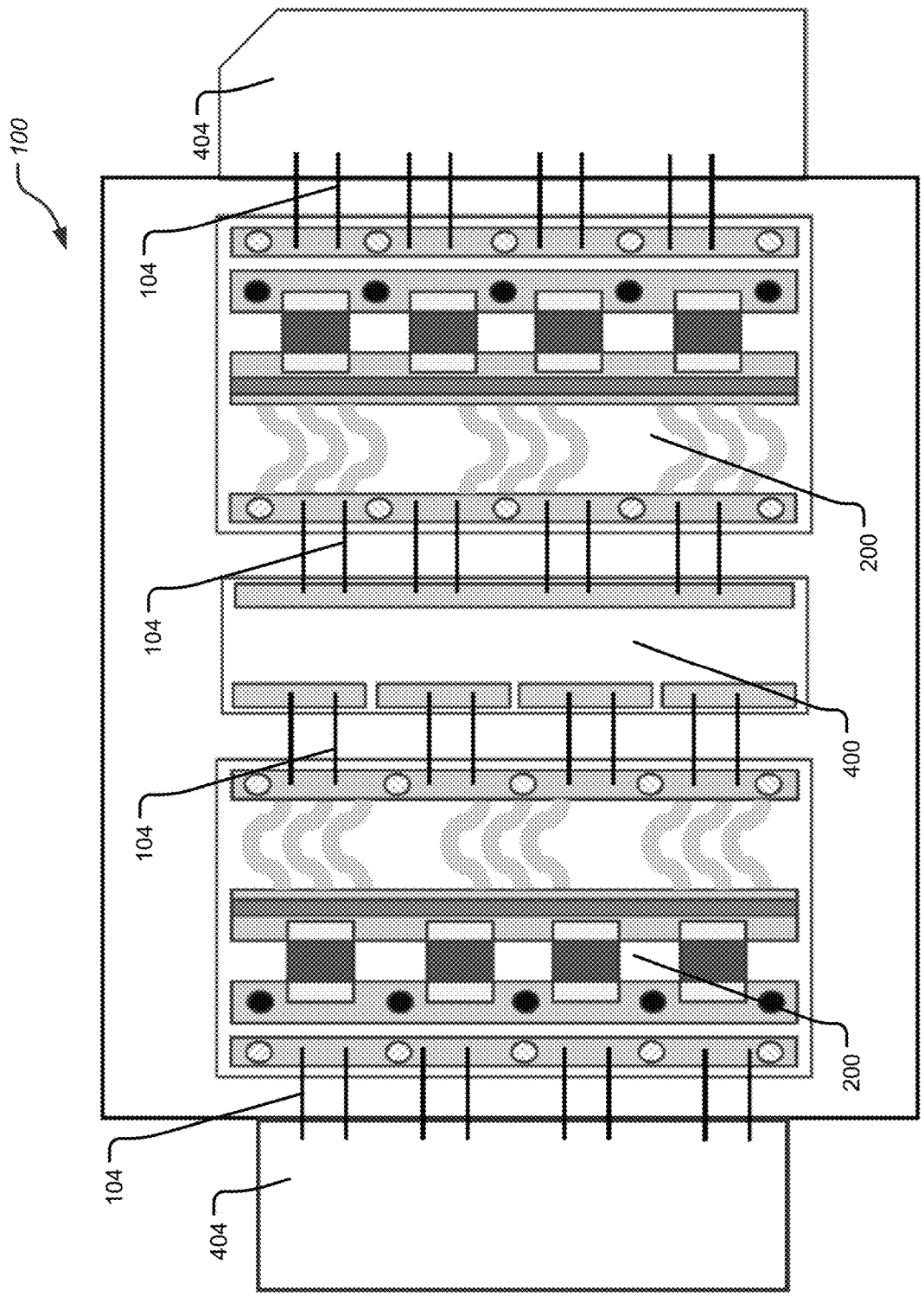
FIG. 14 illustrates a partial top view of the package according to another particular aspect of the disclosure.

FIG. 14 illustrates a partial top view of the package according to another particular aspect of the disclosure.

In particular, FIG. 14 illustrates the package 100 that may include any and all features, configurations, arrangements, implementations, aspects and/or the like as described herein. Additionally, FIG. 14 illustrates that the package 100 implementing the at least one IPD component 200 of FIG. 13 as a multi-layer ceramic IPD for input and output. Note that with this configuration, only few short wire bonds are needed from the one or more semiconductor devices 400 to the at least one IPD component 200, and from the end of the at least one IPD component 200 to the one or more metal contacts 404 implemented as RF input leads and/or RF output leads. In addition, the absence of wire bond loops over the top of the at least one device 202, such as SMD caps, may help reduce input/output coupling in the package 100 and may give improved stability and gain, as well as saving on cost of gold wire-bonds.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultrawideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The at least one IPD component 200 may be an active device, a passive device, an integrated passive device (IPD), a transistor device, or the like. The at least one IPD component 200 may include any electrical component for any application. In this regard, the at least one IPD component 200 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultrawideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The at least one IPD component 200 implemented as a radio frequency device may be configured to, may support, or the like transmitting a radio wave and modulating that wave to carry data with allowable transmitter power output, harmonics, and/or band edge requirements. The at least one IPD component 200 implemented as a radio frequency device may be configured to, may support, or the like receiving a radio wave and demodulating the radio wave. The at least one IPD component 200 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

In one aspect, the at least one IPD component 200 may be a high-electron mobility transistor (HEMT). In this regard, the HEMT may be Group III-Nitride based devices and such HEMTs may be implemented for high power Radio Frequency (RF) applications, for low frequency high power switching applications, as well as other applications. For example, the material properties of Group III-nitrides, such as GaN and its alloys, enable achievement of high voltage and high current, along with high RF gain and linearity for RF applications. A typical Group III-nitride HEMT relies on the formation of a two-dimensional electron gas (2DEG) at the interface between a higher band gap Group-III nitride (e.g., AlGaN) barrier layer and a lower band gap Group-III nitride material (e.g., GaN) buffer layer, where the smaller band gap material has a higher electron affinity. The 2DEG is an accumulation layer in the smaller band gap material and can contain a high electron concentration and high electron mobility.

Figure 15:
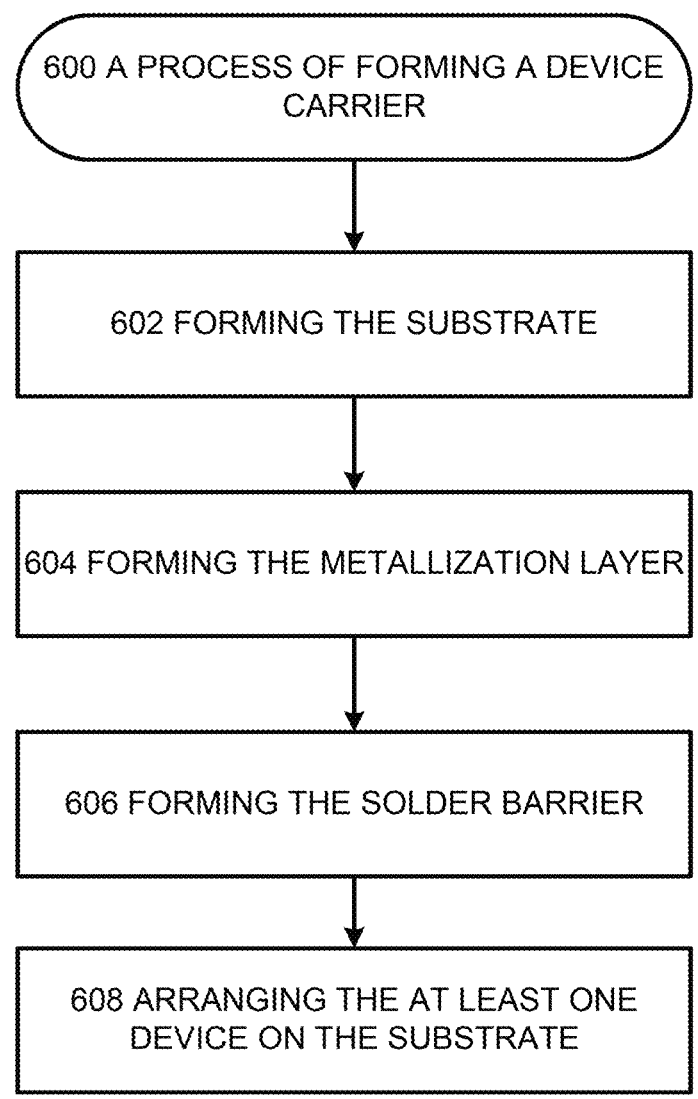
FIG. 15 shows a process of making a IPD component according to the disclosure.

FIG. 15 shows a process of making a IPD component according to the disclosure.

In particular, FIG. 15 illustrates a process of forming a IPD component 600 that relates to the IPD component 200 as described herein. It should be noted that the aspects of the process of forming a IPD component 600 may be performed in a different order consistent with the aspects described herein. Additionally, it should be noted that portions of the process of forming a IPD component 600 may be performed in a different order consistent with the aspects described herein. Moreover, the process of forming a IPD component 600 may be modified to have more or fewer processes consistent with the various aspects disclosed herein.

Initially, the process of forming a IPD component 600 may include a process of forming the substrate 602. More specifically, the substrate 204 may be constructed, configured, and/or arranged as described herein. The process of forming the substrate 602 may include forming the substrate 204 to include Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material, the substrate 204 may be fabricated as an Alumina substrate, Aluminum Nitride (AlN) substrate, Beryllium oxide (BeO) substrate, and/or other similar thermal conductivity performance dielectric material substrate, the substrate 204 may comprise Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material. In one aspect, manufacturing the substrate 204 may start with an Alumina strip. The strip size may be optimized to what subsequent assembly equipment like SMT, Dicing and Die Attach Equipment can handle.

Further, the process of forming a IPD component 600 may include forming the metallization layer 604. More specifically, the metallization layer 240 may be constructed, configured, and/or arranged as described herein on at least a portion of the substrate 204. The process of forming the metallization layer 604 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the forming the metallization layer 604 may include forming the interconnect pad. More specifically, the plurality interconnect pads 206 may be constructed, configured, and/or arranged as described herein on the substrate 204. The process of forming the interconnect pad may include utilizing one or more manufacturing techniques including using print screening for solder past, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the process of forming a IPD component 600 may include forming the solder barrier 606. In one or more aspects, the solder barrier 216 may be formed in select regions on an upper surface of the at least one IPD component 200. In further aspects, the solder barrier 216 may be arranged over the entire surface of the at least one IPD component 200 and selectively etched and/or otherwise removed from select locations on the upper surface of the at least one IPD component 200.

Additionally, the process of forming a IPD component 600 may include arranging the at least one device on the substrate 608. More specifically, the at least one device 202 may be constructed, configured, and/or arranged as described herein on the substrate 204. In one aspect, the at least one device 202 may be arranged as described herein on the substrate 204 with an adhesive, soldering, sintering, eutectic bonding, ultrasonically welding, and/or the like as described herein.

More specifically, the process of forming a IPD component 600 may include manufacturing to form the at least one IPD component 200 in a panel. The process of forming a IPD component 600 may include implementing a pick and place assembly to place the at least one device 202 on the at least one IPD component 200 of the panel. The process of forming a IPD component 600 may include implementing a reflow process with the panel. The process of forming a IPD component 600 may include cutting the panel utilizing cutting equipment such as wafer, circuit board, or package sawing equipment to singulate the at least one IPD component 200 from the panel, which may have the advantage that the at least one IPD component 200 may be arranged on dicing tape on a ring frame, which can be directly loaded to the Die Attach equipment for subsequent assembly into package 100.

In one aspect, the process of forming a IPD component 600 may include may processing utilizing a surface mount technology (SMT) line. A surface mount technology (SMT) line may utilize numerous processes including solder printing, component placement, solder reflow, and/or the like. additional processes may include a flux cleaning step to remove all flux residues, wire bonding, dicing, mounting to dicing tape, dicing, either mechanical sawing or laser cutting, or a combination of both, and component testing. Additionally, the at least one IPD component 200 may be arranged on dicing tape that may then serve as input for the Die Attach equipment.

Figure 16:
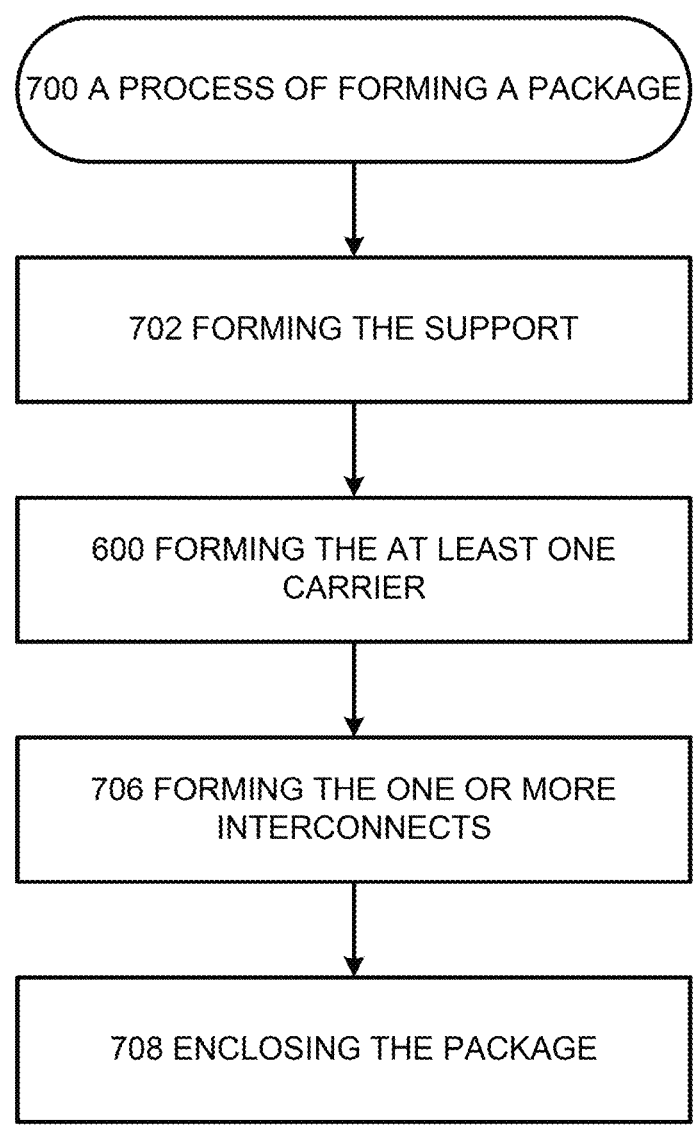
FIG. 16 shows a process of making a package according to the disclosure.

FIG. 16 shows a process of making a package according to the disclosure.

In particular, FIG. 16 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include a process of forming the IPD component 600. More specifically, the at least one IPD component 200 may be constructed, configured, and/or arranged as described herein with reference to FIG. 15 and the associated description thereof. Thereafter, the process of forming the IPD component 600 may further include attaching the at least one IPD component 200 to the support 102. In this regard, the at least one IPD component 200 and/or the substrate 204 may be mounted on the upper surface of the support 102 by an adhesive, soldering, sintering, eutectic bonding, ultrasonically welding, and/or the like as described herein.

The process of forming a package 700 may include a process of forming the one or more interconnects 706. More specifically, the one or more interconnects 104 may be constructed, configured, and/or arranged as described herein. In one aspect, the process of forming the one or more interconnects 706 may include forming the one or more interconnects 104 by forming one or more wires, leads, vias, edge platings, circuit traces, tracks, and/or the like. In one aspect, the process of forming the one or more interconnects 706 may include connecting the one or more interconnects 706 by an adhesive, soldering, sintering, eutectic bonding, ultrasonic welding, a clip component, and/or the like as described herein.

The process of forming a package 700 may include a process of enclosing the package 708. More specifically, the package 100 may be constructed, configured, and/or arranged as described herein. In one aspect, the process of enclosing the package 708 may include forming an open cavity configuration, an over-mold configuration, or the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An RF transistor package, comprising:
a metal submount;
a transistor die mounted to said metal submount;
a surface mount IPD component mounted to said metal submount, said surface mount IPD component comprising a dielectric substrate comprising a top surface and a bottom surface and at least a first pad and a second pad arranged on a top surface of said surface mount IPD component;
at least one surface mount device comprising a first terminal and a second terminal, said first terminal of said surface mount device mounted to said first pad and said second terminal mounted to said second pad;
at least one of the first terminal and the second terminal being configured to be isolated from the metal submount by said dielectric substrate; and
at least one wire bond bonded to at least one of the first pad and the second pad.

2. The RF transistor package according to claim 1 wherein the surface mount IPD component comprises an Alumina substrate.

3. The RF transistor package according to claim 1 wherein the surface mount IPD component comprises a dielectric substrate.

4. The RF transistor package according to claim 1 wherein the surface mount IPD component comprises a multilayer dielectric substrate.

5. The RF transistor package according to claim 1 wherein the surface mount IPD component comprises a metallic surface configured to implement a circuit structure that comprises one or multiple of the following: capacitor, an inductor, and a resistor.

6. The RF transistor package according to claim 1 wherein the transistor die comprises one or multiple LDMOS transistor die.

7. The RF transistor package according to claim 1 wherein the transistor die comprises one or multiple GaN based HEMTs.

8. The RF transistor package according to claim 1 wherein the RF transistor package comprises a plurality of transistors.

9. The RF transistor package according to claim 8 wherein the plurality of transistors are configured in a Doherty configuration.

10. The RF transistor package according to claim 1 wherein the surface mount IPD component comprises a plurality of surface mount devices mounted to the top surface of said surface mount IPD component.

11. The RF transistor package according to claim 1 wherein the dielectric substrate comprises at least one of the following: a via configured to make an electrical connection between the surface mount device and the metal submount, edge plating configured to make an electrical connection between the surface mount device and the metal submount, wire bonding configured to make an electrical connection between the surface mount device and the metal submount, a clip configured to make an electrical connection between the surface mount device and the metal submount.

12. An RF transistor package, comprising,
a metal submount;
a transistor die mounted to said metal submount;
a surface mount IPD component mounted to said metal submount, said surface mount IPD component comprising a dielectric substrate comprising a top surface and a bottom surface and at least a first pad and a second pad arranged on a top surface of said surface mount IPD component;
at least one surface mount device comprising a first terminal and a second terminal, said first terminal of said surface mount device mounted to said first pad and said second terminal mounted to said second pad;
at least one of the first terminal and the second terminal being configured to be isolated from the metal submount by said dielectric substrate; and
at least one wire bond bonded to at least one of the first pad and the second pad,
wherein the surface mount IPD component comprises a substrate comprising at least one of the following: Alumina, Aluminum Nitride (AlN), and Beryllium oxide (BeO).

13. A device, comprising:
a surface mount IPD component configured to be mounted to a metal submount of a transistor package, said surface mount IPD component comprising a dielectric substrate comprising a top surface and a bottom surface and at least a first pad and a second pad arranged on a top surface of said surface mount IPD component;
at least one surface mount device comprising a first terminal and a second terminal, said first terminal of said surface mount device mounted to said first pad and said second terminal mounted to said second pad; and
at least one of the first terminal and the second terminal being configured to be isolated from the metal submount by said dielectric substrate,
wherein at least one of the first pad and the second pad are configured as wire bond pads.

14. The device according to claim 13 wherein the surface mount IPD component comprises a substrate comprising at least one of the following: Alumina, Aluminum Nitride (AlN), and Beryllium oxide (BeO).

15. The device according to claim 13 wherein the surface mount IPD component comprises an Alumina substrate.

16. The device according to claim 13 wherein the surface mount IPD component comprises a substrate.

17. The device according to claim 13 wherein the surface mount IPD component comprises a multilayer substrate.

18. The device according to claim 13 wherein the surface mount IPD component comprises a metallic surface configured to implement a circuit structure that comprises one of the following: capacitor, an inductor, and a resistor.

19. The device according to claim 13 wherein the surface mount IPD component is configured to be implemented in an RF transistor package that comprises an LDMOS transistor die.

20. The device according to claim 13 wherein the surface mount IPD component is configured to be implemented in an RF transistor package that comprises a GaN based HEMT.

21. The device according to claim 13 wherein the surface mount IPD component is configured to be implemented in an RF transistor package that comprises a plurality of transistors.

22. The device according to claim 13 wherein the surface mount IPD component comprises a plurality of surface mount devices mounted to the top surface of said surface mount IPD component.

23. The device according to claim 13 wherein the dielectric substrate comprises at least one of the following: a via configured to make an electrical connection between the surface mount device and the metal submount, edge plating configured to make an electrical connection between the surface mount device and the metal submount, wire bonding configured to make an electrical connection between the surface mount device and the metal submount, a clip configured to make an electrical connection between the surface mount device and the metal submount.

* * * * *